（12） United States Patent
Inditsky

(10) Patent No.: US 8,684,584 B2
(45) Date of Patent: Apr. 1, 2014

(54) ULTRA-THIN BACKLIGHT

(76) Inventor: Benzion Inditsky, Holon (IL)

( * ) Notice: Subject to any disclaimer, the term of this patent is extended or adjusted under 35 U.S.C. 154(b) by 454 days.

(21) Appl. No.: 12/906,502

(22) Filed: Oct. 18, 2010

(65) Prior Publication Data

US 2011/0085112 A1  Apr. 14, 2011

Related U.S. Application Data

(60) Continuation-in-part of application No. 11/958,811, filed on Dec. 18, 2007, now Pat. No. 7,815,358, which is a continuation of application No. 11/292,749, filed on Dec. 5, 2005, now Pat. No. 7,338,197, which is a division of application No. 10/145,078, filed on May 15, 2002, now Pat. No. 7,001,058.

(60) Provisional application No. 60/291,475, filed on May 16, 2001.

(51) Int. Cl.
*F21V 8/00* (2006.01)

(52) U.S. Cl.
USPC .......... 362/615; 362/628; 362/561; 362/97.1; 385/146

(58) Field of Classification Search
USPC ......... 362/615, 628, 559, 561, 560, 551, 511, 362/97.1–97.4; 385/146, 129, 130; 349/62, 349/63, 65
See application file for complete search history.

(56) References Cited

U.S. PATENT DOCUMENTS

| | | | |
|---|---|---|---|
| 1,758,041 A | 5/1930 | Heymann | |
| 2,981,826 A | 4/1961 | Mattern | |
| 4,915,479 A | 4/1990 | Clarke | |
| 4,974,122 A | 11/1990 | Shaw | |
| 5,283,673 A | 2/1994 | Murase et al. | |
| 5,303,322 A | 4/1994 | Winston et al. | |
| 5,357,405 A | 10/1994 | Park | |
| 5,375,043 A | 12/1994 | Tokunaga | |
| 5,461,547 A | 10/1995 | Ciupke et al. | |
| 5,594,830 A | 1/1997 | Winston et al. | |
| 5,613,751 A | 3/1997 | Parker et al. | |
| 5,704,703 A | 1/1998 | Yamada et al. | |
| 5,719,649 A | 2/1998 | Shono et al. | |
| 5,796,450 A | 8/1998 | Kanda et al. | |
| 5,860,723 A | 1/1999 | Domas et al. | |
| 5,892,325 A | 4/1999 | Gleckman | |
| 5,896,119 A | 4/1999 | Evanicky et al. | |
| 5,949,505 A | 9/1999 | Funamoto et al. | |
| 5,962,971 A | 10/1999 | Chen | |
| 6,002,829 A | 12/1999 | Winston et al. | |

(Continued)

FOREIGN PATENT DOCUMENTS

EP  0491963  7/1992

*Primary Examiner* — Bao Q Truong
(74) *Attorney, Agent, or Firm* — Nixon Peabody LLP

(57) ABSTRACT

A thin-profile, optically efficient lighting device for use with, among other things, flat information displays, includes a combination of two optically coupled light propagating structures. The first structure may be a compound hyperbolic-elliptic element, adapted to receive light from at least one light source, such as a light emitting diode, and inject it into the second structure, which generally is larger and has hyperbolic-elliptic shape and a plurality of flux extractors. The latter redirect the light flux so that it propagates out of the second structure with a desired luminance and/or intensity distribution in a direction that is essentially perpendicular to the surface of the second structure. The flux extractors may also be of the active, i.e. wavelength-converting, type.

35 Claims, 19 Drawing Sheets

(56) References Cited

U.S. PATENT DOCUMENTS

| | | |
|---|---|---|
| 6,043,591 A | 3/2000 | Gleckman |
| 6,044,196 A | 3/2000 | Winston et al. |
| 6,104,455 A | 8/2000 | Kashima |
| 6,123,436 A | 9/2000 | Hough et al. |
| 6,139,162 A | 10/2000 | Masaki |
| 6,217,188 B1 | 4/2001 | Wainwright et al. |
| 6,259,496 B1 | 7/2001 | Kashima |
| 6,473,554 B1 | 10/2002 | Pelka et al. |
| 6,676,268 B2 | 1/2004 | Ohkawa |
| 7,001,058 B2 | 2/2006 | Inditsky |
| 7,263,268 B2 | 8/2007 | Inditsky |
| 7,338,197 B2 | 3/2008 | Inditsky |
| 7,748,882 B2 | 7/2010 | Inditsky |
| 7,815,358 B2 * | 10/2010 | Inditsky ................. 362/615 |
| 8,297,786 B2 * | 10/2012 | Shani et al. .............. 362/97.3 |
| 8,388,159 B2 * | 3/2013 | Zhu et al. ................ 362/97.1 |
| 8,556,456 B2 * | 10/2013 | Boonekamp et al. ......... 362/235 |

* cited by examiner

ULTRA-THIN BACKLIGHT

CROSS REFERENCE TO RELATED APPLICATIONS

The present application is a continuation-in-part of U.S. application Ser. No. 11/958,811, filed Dec. 18, 2007 which is a continuation of U.S. application Ser. No. 11/292,749, filed Dec. 5, 2005 (now U.S. Pat. No. 7,338,197), which is a divisional of U.S. application Ser. No. 10/145,078 filed May 15, 2002 (now U.S. Pat. No. 7,001,058), which claims the benefit of U.S. Provisional Application 60/291,475, filed May 16, 2001, all herein incorporated in their entirety by reference.

FIELD OF THE INVENTION

The present invention relates to illumination devices and backlights for transmissive display devices and, in particular, to thin, efficient and uniformly bright illuminators and backlights based on light guiding plates for use with, e.g., Liquid-Crystal Displays (LCD), signage and general illumination.

TERMINOLOGY

The following groups of terms are used throughout the present disclosure, the terms in each group being mutually equivalent and interchangeable:
  Lighting Device/Flat Illumination Device/FID
  Display Device/Display System
  Light Extractor/Light Extraction Device/Extractor
  HOW/Hybrid Optical Waveguides
  Principal Radiation Carrier/PRC
  Secondary Radiation Carrier/SRC/Nonlinear Wedge/NLW/Tapered Wedge/Aspherical Asymmetrical Edge Lens/AAEL
  Hybrid Optical Pipe Ejector/HOPE (an extended planar or wedge Waveguide Ejector with distributed flux extraction means);
  Distributed Optical Pipe Ejectors/DOPE (with directional flux ejection properties);
  Distributed Optical Pipe Injectors/DOPI
  Full Crater/Central Foconic Coupler (coupled to NLW).
  LGP/Lightguiding Plate/SRC
  CF/Cover Factor/Cover Ratio (of extractors).
  IPR/Induced Photonic Recycling.
  TRAP/triangular right angle pyramid (tetrahedron).
  Mesa shape/Truncated Polyhedron.
  LE/Light Engines
  MIRs/Multiple Interreflections/Flux Recycling/Flux Retroreflection/Residual Flux (any flux not ejected from the system in a first photon pass)
  PcLED/Phosphor Converted LED.
  EQE/External Quantum Efficiency.
  MEC/Multiple Escape Cones
  EI/Extraction Invariant
  VECO/Volume and EQE (or EPE—external photon efficiency) conserving optics.

BACKGROUND

A prevalent class of two-dimensional electro-optical display devices, for displaying digitally provided images, is a flat transmissive device wherein the transmission at each pixel is controllably modulatable. The most common type of this class is the Liquid-Crystal Display (LCD), which is widely used in computers, especially of the portable kind, and in small display systems for viewing through ocular optics. Every such display device must be provided with a light source that illuminates its back face so that its light is transmitted across the device, while being image-wise modulated by it. This light source is commonly referred to as a "backlight." The primary requirement for such a backlight is that its brightness, as viewed from the front, is of a sufficiently high overall level, and that it is relatively uniform over the face of the display. In the case of computer displays, there is another major requirement, namely that the backlight be relatively thin—in keeping with the thinness of the display device itself and thus forming a complete display assembly whose depth dimension is appreciably smaller than any dimension of its face. In what follows any light transmissive display device will be referred to as a LCD, without detracting from the applicability of the invention to other types of transmissive display devices.

For large display devices, backlights have traditionally been constructed of an array of fluorescent tubes behind a light diffusing screen. Such traditional backlights are characterized by poor brightness uniformity and by small aspect ratio. Aspect ratio (AR) is defined as the ratio of the diagonal size of the illumination window (or illumination aperture, as it will be termed hereafter) to the maximum depth dimension of the backlight.

A more recent type of backlight—the so-called edge coupled type—employs a light source coupled to an edge of a light guiding plate (LGP), along which the light flux propagates by total internal reflection (TIR) with almost no losses. This enables constructing backlights with very large AR—typically of 50-100—for 10-20" diagonal LCDs used in existing portable and desktop computers. In these types of devices a light source, usually a cold cathode fluorescent lamp, introduces light into a light guiding plate (LGP), through an edge surface thereof. The LGP is so structured that part of the light entering through the edge radiates out through the LGP's front face. The LGP is so oriented that its front face or surface is parallel to the faces of the display device and proximate thereto, and thus light radiating from the LGP illuminates the display device and is transmitted there through. If the display device is a LCD, there is also typically disposed between it and the LGP a polarizing sheet. Several additional components are often used to increase the brightness and uniformity of the transmitted light, these include: a reflector behind the lamp; reflectors behind the LGP's back face and at other edge surfaces; one or two orthogonal oriented lenticular films in front of the LGP's front face; a diffusing film behind the display device.

Due to its inherent compactness, ease of operation and luminance efficiency, a much more suitable type of light source for such applications (instead of fluorescent lamps) is a light-emitting diode (LED). FIG. 1A shows a prior art cavity type LED-based backlight 10 that is analogous to an integrating sphere as described, for example, in U.S. Pat. Nos. 5,892,325 and 6,134,092. The interior of the cavity 12 is typically constructed of a white diffusely reflecting material of high reflectivity (greater than 95-99%) and backed with a surface of a diffusive, reflecting material 14. The LED light source 14 is coupled to an edge of the cavity 12 and along with the cavity is disposed in a housing 18. Disposed adjacent and proximate to the front surface of the cavity, e.g., the surface opposite the surface backed with the diffusive material, are the one or more layers 20a, 20b, and 20c of brightness enhancing films (BEFs), diffusers and materials described below and unique to the different types of LCDs. Finally disposed in front of the layers 20a-20c is the image display device, namely the LCD 22.

Another prior art backlight using multiple LEDs coupled to two edges of a planar LGP is depicted in FIG. 1B. The use of multiple LEDs is dictated by a need to improve the luminance uniformity, which is poor (remains below an acceptable value) with one LED in existing devices. With recently developed high flux, "Ultra-Bright" LEDs a smaller number of more efficient LEDs can be used to produce a given display luminance. A prerequisite for such a device is a maximally thin LGP-based optical architecture accomplishing significantly better luminance uniformity, which is an object of the present invention. Multiple LEDs can also be used to attain higher display luminance as is needed in high information density (high resolution) graphic LCDs for 3G wireless devices, PALMS etc.

While more compact than the previously mentioned devices, the device of FIG. 1A still suffers from several practical problems. First, the device of FIG. 1A is still very large in all dimensions with respect to the size of the illumination aperture and has the additional disadvantage of being energetically inefficient. In practice, the requirement of uniform illumination with cavital design is difficult to achieve, in particular for larger and thinner configurations, i.e., larger aspect ratio designs. Indeed, the performance of such a device imposes two conflicting requirements on AR. On one hand, to achieve brightness uniformity the AR should be small, assuring that all of the cavity's surfaces projecting through the exit aperture are uniformly illuminated by a relatively small number of multiple interreflections (MIRs) of the highly nonuniform light flux emanating from the light source. This reduces reflection losses and increases efficiency. On the other hand, the AR should be sufficiently large to allow a commercially and technically acceptable depth dimension of a device. As a result, prior art devices are bulky in terms of depth dimension and/or cannot assure an acceptable uniformity for larger displays. Typical devices require that 4<AR<10 as specified in, for example, U.S. Pat. No. 6,043,591, while analysis indicates that the achievable uniformity with such designs is only on the order of 1.3:1. While these performance criteria may be suitable for some LCD applications, they are not sufficient for applications using multicolored LED sources, as described below, in which a uniformity between the illumination colors of 1.05:1 is required in order to prevent perceivable color shifts.

A partial solution known as a compound cavity-TIR system is described in U.S. Pat. No. 6,043,591, which suggests filling the cavity with a fluid. However, the internal reflections within the fill medium are still diffuse at all lambertian cavital surfaces, as a result of direct optical contact. In fact, only an upper surface of such filled cavity acts as a light guide, but its ratio to the total surface area of the cavity is too small to have any significant positive effect. As a result, such systems fail to appreciably improve the backlight luminance efficiency and achievable AR.

As noted above, the best solution to date for LED-illuminated backlights would seem to be the use of a light guiding plate (LGP), which distributes the light flux by total internal reflection (TIR). However as realized herein, several practical problems inherent to such a system are compounded in the case of small-aperture LGP-based backlights. A first of these practical problems include the fact that a relatively thick planar LGP, with 1<AR<10, suffers from elevated light flux losses, since, with existing extraction means, a large fraction of the LED-injected flux inevitably reaches the opposite edge of the LGP and is coupled out on the proximal outer reflector; it is then coupled again into the LGP, travels in a reverse direction and eventually ends up on the LED, where it is totally or partially absorbed. An optimal LGP should reduce this residual flux and ensure that a maximal fraction of the initially forward propagating flux from the LED should be extracted in a first pass. Even with thinner LGPs, e.g., 1-2 mm, having optimized extractor distributions described below, the AR is still relatively small so as to make this problem significant.

Light extraction in a flat illumination device ("FID") can also be effected by using a tapered LGP the faces of which are mutually inclined at some angle THETA, thus forming a wedge, rather than a planar parallel-faced plate. As the flux from the lamp, coupled to the edge of the plate, propagates along the wedge, the angles of incidence PI.HI are reduced by 2.theta. at each reflection from the inclined face(s). When the angle .phi. of any flux component becomes smaller than a critical angle of TIR, this flux is coupled out from both faces of the LGP in a number of successive reflections in a forward direction, following the Fresnel equations. The flux is extracted at the directions close to the grazing angles and some internal or external diffusing and/or concentrating elements can be used to modify the spatial luminance, or luminous intensity distribution, to satisfy the particular requirements. Some of the forward propagating flux reaching the opposite and adjacent LGP edges is eventually reflected by an external reflector into a backward path, as well as sideways skewed paths. Linear one dimensional (i.e., having constant inclination angle along one orthogonal direction) wedge-like LGPs are described in relation to a number of FIDs, in, for example, U.S. Pat. Nos. 6,104,455 and 6,259,496. However, these linear wedge shaped devices inherently produce a significantly non-uniform luminance, this non-uniformity growing with the LGP's length.

U.S. Pat. No. 5,357,405 describes a nonlinear semi-cylindrical concave surface which effects, in combination with additional light extracting means, better uniformity. This one-dimensional nonlinear wedge is not designed to produce uniform luminance independently. U.S. Pat. Nos. 5,303,322; 6,002,829 and 6,044,196 describe the possibility of using a one-dimensional nonlinear wedge for compensating light output irregularities for a special type of tapered multilayer devices that are very different from the FIDs under consideration. These patents fail to teach any practical solutions and in fact, the expanding convex wedges qualitatively depicted therein necessarily suffer from augmented non-uniformity as compared to linear wedges. Further, the attempt to analyze the problem using general adiabatic invariant cannot produce any meaningful solution since one has to consider the exact convolutions of Fresnel equations in three dimensional domain with complex boundary conditions, imposed by the LGP shape, and backward propagating residual flux.

Apart from reducing average thickness and bulk material, the wedge can be used for effective light extraction in the first pass and reduction of the residual flux and accompanying losses. Indeed, it directly follows from the General Photometric Invariant (so-called etendue conservation principle), that a total flux extracted from horizontal face(s) of a one dimensional wedge in a first forward pass is proportional to $(Z_{max} - Z_{min})/Z_{max}$, where $Z_{max}$, and $Z_{min}$—are respectively maximal and minimal thickness of the wedge.

A second practical problem resides in the fact that in order to attain high illumination uniformity, light extraction from the LGP's internal flux should be nonuniform. In relatively large backlights, illuminated by extended tubular lamps (such as cold cathode fluorescent lamps), the extractors' density distribution over the face of the LGP should be greater the further away they are from the source. This is illustrated in, for example, U.S. Pat. Nos. 5,283,673; 5,796,450; 5,949,505;

and 5,896,119. Indeed, flux density inside the LGP having some extractor means is generally not uniform and diminishes gradually with increasing distance from the light source. Thus, if the extractors were to be uniformly distributed over the face, extracted light intensity would likewise vary across it. In order to overcome this phenomenon, the extractor elements in prior art devices are distributed non-uniformly, being more sparse near the lamp and more crowded near the opposite edge. Light extractor areas are characterized by a cover factor (CF), representing a ratio of extractor area to an elementary unit area, located anywhere within a light extracting face(s) of an LGP.

A third practical problem related to the fact that an efficient coupling architecture is required to take the light emitted from a LED source and inject it efficiently into a thin lightguide. LEDs with conventional primary optics (lens-like or flat shaped epoxy encapsulants in direct optical contact with the LED emitter and/or reflector cup) suffer from very significant losses due to Fresnel retroreflection of initially emitted flux. This phenomenon takes place during the passage of radiation at the interface between the LED emitter (N=3.5-3.7) and the encapsulant (N=1.5-1.6) and at the interface between the encapsulant and air. Similar losses also occur for LEDs with a cup-shaped or cup reflector surrounding the emitter. In the latter case some of the flux reflected by such a reflector reaches an emitter or strikes an encapsulant-air interface at large angles causing an augmented retroreflection. Most of the thus retroreflected flux is absorbed in the LED, causing output losses and eventual elevation of LED chip temperature, which reduces the LED's luminous efficacy. This is a problem as current LED backlights only have optical efficiencies in the range of 50-75% and uniformity typically in the 1.3-1.4:1 range.

To solve this problem U.S. Pat. No. 6,473,554, by Pelka and Popovich, utilizes symmetric hyperbolic cuspated TIR reflector situated just over an LED light source, with the axis of revolution in a vertical direction. This reflector conditions the rays going upward from the source to be injected into a planar waveguide. The principal characteristic of this approach is its aspect ratio, with device diameter two or more times device thickness. For many FIDs including relatively large SRC, however, vertical size must be minimized, such as with LED powered backlights and most of signage devices, since a coupler can be placed outside an active illumination window. Pelka's reflector has a number of other deficiencies limiting their practical application:

Large overall depth-diameter dimensions, since no method is disclosed to minimize device's vertical and horizontal dimensions A most compact solution with 1:2 aspect ratio cannot be easily mass-replicated since its lower apex portion has almost vertical walls with a miniscule air gap.

It operates only with planar SRC having an excessive weight.

The discussion so far has not included the subject of color. This subject is important even for monochromatic displays. In fact, because of their inherent spectral characteristics, the use of LEDs makes white illumination problematic, but at the same time may also provide advantages when applied according to the present invention, all as described herein below.

A typical "white" LED, made by Nichia, Ltd. consists of a bright blue LED covered with a yellowish phosphor coating. This backlight has approximately the same dimensions as the flat fluorescent type (described above), weighs about 8 g, has a uniformity of about 1.4:1 and emits 150 fL. Any backlight that uses a white lamp as the light source, including the above-mentioned white LED, has an important drawback, namely that the spectrum of the emitted light is fixed and is determined almost solely by that of the lamp. This, in turn, determines the absolute color of the display, if monochromatic, and of white portions (and consequently also of other portions) of a displayed color image, which color is also known as the "white point." In many applications, whether for monochrome or for color displays, it is important to be able to control the white point. In the aforementioned conventional type of backlights such a control is very difficult, in that it can only be accomplished by carefully selecting the lamp or by interposing suitable correction filters. Moreover, the white point may change with the life of the lamp.

To display color images, the common practice is to employ a transmissive display device, such as an LCD, in one of several different arrangements. A first arrangement includes an array of color filters, usually of the three additive primary colors (red, green and blue), congruent to a suitable array of light modulating elements, or pixels. In this first arrangement, known as a filter-array arrangement, A backlight, such as described hereabove, is employed for such a color LCD in much the same manner, as long as the spectrum of its emitted light is broad enough to include the transmission spectra of all the filters. In operation, the light transmitted through any modulation element of the LCD, is spectrally filtered by a corresponding filter; all elements corresponding to red filters thus form the red component image and the green and blue components are similarly formed. Because of the small size of the elements, relative to the resolution of a human eye, the three images combine in the observer's eyes into a continuous fill-color image.

This practice has several major drawbacks. First, appreciably less than one third of the light energy emitted by the backlight is transmitted by each filter and thus the apparent brightness of the display, even in white areas of the image is considerably lower than it would have been with a monochromatic LCD device, given the same lamp intensity. In other words, the display efficiency is considerably reduced. A second drawback is that color-filter-array type LCDs has relatively high cost of manufacturing due to the intricacies of the manufacturing process. A third drawback relates to the fact that, for a given pixel resolution, the basic LCD resolution must be at least three times higher (per unit area). This last drawback has become a particular liability in the case of small-aperture display devices, especially as they simultaneously strive for higher resolution, which correspondingly puts a premium on pixel real estate, while requiring even more pixels in the shrinking space.

A second arrangement, known as Color Field Sequential Imaging (CFSI) method for transmissive color displays is also known in the art. This second arrangement basically consists of a monochrome LCD and three light sources, each of a respective primary color, illuminating its back. Signals corresponding to the three primary-color component images are applied to the LCD sequentially, in a regular cycle. Synchronously with the application of each such component a corresponding one of the three light sources is switched on so as to illuminate the LCD while it image-wise modulates the transmitted light according to the corresponding color component. All three color components are thus sequentially displayed for each frame of video and therefore their rate is three times the regular video rate (e.g. 180 Hz). Because of the image retention characteristics of the human eye, all three components are effectively merged into a single full-color image corresponding to the respective video frame.

A sequential color display type, such as described herein, inherently overcomes the three drawbacks of filter-array display type devices as they allow practically all the light energy that is applied to the LCD over white areas of the image to be transmitted. Further, the LCD itself is a monochromatic type and thus relatively inexpensive both in terms of components and in terms of the manufacturing process. Finally, the relative intensities of the three light sources may be adjusted so as to achieve any desirable white point.

In order to illuminate the above-mentioned sequential color LCD, a backlight with the ability to iterate quickly enough between the three basic colors is needed. This is provided by a LED-based backlight architecture, using very bright red, green and blue (RGB) LED's to create uniform fields of sequential RGB light. Since LED's can switch on and off in 15 nanoseconds, they can succeed in this application, whereas RGB fluorescent lights cannot because of the long fluorescent decay times between successive on/off states of the RGB phosphors. LEDs also inherently possess the desirable characteristics of maximum color saturation and high photonic efficiency. According to prior art, LEDs cannot, however, be practically used to illuminate the edge of a LGP to serve as a backlight, because each is, in effect, a point source of light (as opposed to the elongated format of the light emitted by CCFLs), which causes the resulting pattern of light flux emitted from the face of a typical LGP to be highly non-uniform. Therefore, in most prior art backlighting devices, LEDs are positioned in back of the LCD, and not coupled along an edge.

A typical prior-art arrangement, with three LEDs positioned in the back of a diffusing/redirecting screen 30, and enclosed in a housing 34, is shown schematically in FIG. 1C. The LEDs 32 are at a considerable distance from the screen 36, in order to minimize the non-uniformity of illumination over the screen due to the varying distances from the sources. The device 30 typically will further include one or more films or lenses for conditioning the light emitted from the LED. In this case, a Brightness Enhancing Film (BEF) 36 and a diffuser 38 show a typical arrangement. Such prior-art type of colored backlight has a major disadvantage of having a very large depth dimension, contributing to bulkiness of the entire display device. Further disadvantages of such prior-art devices are that the LEDs themselves have a non-uniform radiation pattern, which further contributes to the non-uniformity of the backlight, and that the three LED sources must still be placed at some mutual distances, which causes non-uniformity in the hue of white over the display, as discussed above. U.S. Pat. No. 5,892,325 to Gleckman discloses a backlight comprising a diffusive reflective cavity, which is illuminated from its side, in one configuration—by a plurality of red, green and blue LEDs. This device, however, suffers from the disadvantages already discussed above.

Thus, there exists a need for a backlight for LCDs that provides the advantages of colored LEDs while addressing the limitations inherent is such arrangements. Such a device must be able to monochromatically or color-sequentially illuminate a monochromatic LCD, and have attributes including: Uniform luminance over the entire illumination aperture; uniform color over the entire illumination aperture; high brightness efficiency in utilizing a given light source; and Compact overall dimensions and a thin structure. Preferably the backlight should use LEDs and light-guiding components and also be inexpensive to manufacture.

U.S. Pat. Nos. 7,263,268; 7,748,882, which are fully incorporated by reference describe a new generic compound class of systems with functionally distinct cooperatively acting optical entities termed Hybrid Optical Waveguides (HOW). These include: (1) Principal (or primary) Radiation Carrier (PRC); (2) an extended planar or wedge Waveguide Ejector with distributed flux extraction means referred to hereinafter as a Hybrid Optical Pipe Ejector (HOPE); (3) Distributed Optical Pipe Ejectors (DOPE) with directional flux ejection properties; (4) Distributed Optical Pipe Injectors (DOPI) and foconic couplers collecting and injecting flux from a light source into principal or secondary carriers. The HOPE, DOPE and DOPI are also referred to herein as Secondary Radiation Carriers (SRC).

There is a need and an opportunity to apply HOW structures to the construction of optimal lighting devices, such as may be used to backlight LCD displays, using LEDs.

BRIEF SUMMARY

The discussion in application Ser. No. 11/958,811 (the parent application) has involved the structure of various flat illumination devices (FIDs), as shown, for example in FIGS. 6-16 of that application.

The object of the present invention is to provide improved FID configurations for wide-ranging general and special lighting applications—mainly utilizing a restricted subclass of Hybrid Optical Waveguide ("HOW") systems, comprising a light source, a foconic coupler and a Secondary Radiation Carrier (SRC).

Preferred embodiments of the invention are described further below in terms of specific examples. However, in order to illustrate more comprehensively the practical aspects of the invention and thus aid in understanding these examples, the following paragraphs present a condensed discussion of general design principles and, in particular, of specific efficiency loss mechanisms. While some elements of the configurations disclosed herein have been severally described in the parent application, their unique combinations and significant new structural details, as fully described hereinbelow, are novel and highly useful.

Depending on their geometry and coupling architecture, HOWs can be configured to perform a variety of functions related to transfer, distributed injection, and distributed directional ejection of a radiant energy (i.e. light flux). Some HOW combinations are described below:

1. Source-Coupler-Planar or nonlinear waveguide ejector referred to hereinafter as a Hybrid Optical Pipe Ejector (HOPE);

2. Source-Coupler-DOPEs providing distributed discontinuous (localized) quasi-lambertian or directional flux ejection over the whole area of SRC;

3. DOPIs providing distributed flux injection over the whole area of SRC;

HOW is a principally new generic family of FIDs, developed to remove basic reabsorption losses and other limitations of LED powered devices (which otherwise result in an unbearably high cost and relatively low power efficiency, severely hampering their introduction into a special and general lighting). The new systems significantly remove these cost and efficiency barriers. Not less importantly, they offer a construction of integrated ergonomically optimized large size FIDs—creating visual comfort, uniformity and restricting discomfort and disability glare. In combination with a newly introduced Extraction Invariant it enables to develop a new generic class of "Volume and EQE (or EPE—external photon efficiency) conserving optics" (VECO) ensuring an upper extraction boundary of unity in a smallest and optimally configured device package (spatial configuration, chip texturing and shaping, refractive and reflective elements). Put in another way, for a given value of EPE VECO optics approaches a theoretically predicted thermodynamically limited minimal size. More generally, no physical system comprising any even not yet invented die and phosphor materials can possibly result in any further optimization of optics of any kind, as this would put us in an immediate breach of the basic invariants of the general Light Field theory.

Design principles of various FIDs can generally be grouped into two major groups:

(a) Design for a maximal luminance, i.e. for a smallest flux ejection aperture, applies for many special application lighting systems, e.g. Light Engines (LE) for some types of backlighting, "neon-like" tubular plastic optical fibers (POFs), projection, signaling etc. In these systems a fraction of the initially emitted flux (referred hereinabove as residual flux) is recycled back onto the primary emitter (e.g. LED's active layer), to produce a higher luminance. Since, as explained above, some of the flux is always absorbed as a result of multiple interreflections (MIRs) through the emitter, such recycling inevitably results in a drop in the external quantum efficiency (EQE), i.e. in the lm/W parameter. For extreme needs the present invention provides for such flux recycling to be artificially enhanced so as to produce super bright small light sources. This novel mechanism, illustrated in examples to follow hereinbelow, will be referred to as Induced Photon Recycling (IPR).

(b) Design for maximal efficacy. In this case one strives to produce a system with minimal MIRs in the primary emitter and in the downconverting phosphor, thus minimizing systemic reabsorption losses. Not less important are ergonomical considerations, in particular—disability and discomfort glare caused by a device. Many novel high power LED systems for general lighting continue to be based on an obsolete design philosophy, suitable for indicator and other display lighting applications, with a total disregard of this problem. As a result, large-area mega-nit devices, banned by all existing lighting codes, find their way into the market. Conventional lighting devices are provided with bare lamps (e.g. halogen, CFL etc.) and diffusing, reflecting or shading elements (i.e. luminaires), to reduce or cut-off high luminance from observers' field of view. With LEDs the glare is even more pronounced, as they do not provide indirect lighting of the ceiling as do fluorescent fixtures. In contrast to conventional lighting devices, generally requiring large and stand-alone luminaires, compact solid state lighting (SSL) devices, such as LEDs, offer a unique opportunity to achieve low luminance, using ultra-compact secondary optics integrated with the lighting device, termed DOPE.

Clearly, practical engineering trade-offs should be considered aiming at producing the best blend of lm/$ value, lm/W and device footprint.

Consider next more closely an LED device having downconverting phosphors, e.g. a blue or UV LED with various phosphors that convert the primary light flux to light fluxes of longer wavelengths, in particular—red, green and blue (e.g. "white LED" mentioned above). Let us first introduce a taxonomy for the term "Light Extractor" or simply "Extractor" as used in the context of the present embodiments. Term Extractor has no strict formal physical definition, but is ubiquitously used to denote any device or device component causing a useful extraction of light. In this context it refers to a system component (if not otherwise specified), which, when used with other device components, causes additional light extraction (or redistribution), causing photon ejection out of the device. This extraction is generally caused by an additional scattering of an incident on extractor light, which would otherwise continue to propagate within the device until being absorbed (i.e. trapped within a light-guiding or light generating medium), or outcoupled (ejected) in unsuitable direction (i.e. leaked) or extracted with unsuitable parameters of the extracted flux (e.g. spectral composition, spatial distribution, polarization etc.). Extractors can be subdivided into a number of subclasses:

(a) Various paints, dyes, insoluble pigments to name a few are termed passive extractors in the present context, i.e. they can only subtract wavelengths from the source light, never add new ones (sometimes they are also termed as so called inelastic extractors)

(b) Luminous paint or luminescent paint is paint that exhibits luminescence. In other words, under incident light of a given spectrum (e.g. ultraviolet or monochromatic blue) it gives off visible light of longer wavelengths (light downconverting) through fluorescence, phosphorescence, or radioluminescence. Various organic and inorganic phosphors are the most common example belonging to this subclass, which is termed active extractors (or elastic extractors).

(c) Mixed passive-active extractors representing a mixture of both said subclasses (e.g., a mixture of $TiO_2$ pigment and phosphor colorant, as in some luminescent paints and phosphors).

Extractor can be a thin layer, solution, suspension or compound of scattering agents. Extraction can also be obtained by controlled roughening of the waveguide face(s) (e.g. etching, microlens arrays etc.)

In the context of the present disclose it is immaterial, which Extractor subclass is considered, since both active and passive extractors have a similar optical effect by scattering, reflection, absorption, polarization and/or re-emittance of an incident radiation. Indeed, a flux either passively scattered (e.g. by a thin layer of paint) or/and downconverted by a phosphor have identical quasi-isotropical (or Lambertian) distribution. Passive and active extractors differ only in the reabsorption loss mechanism which affects the output efficiency value. The latter can be accounted for by a simple adjustment of absorption and scattering factors of the extractors. For passive extractors like $TiO_2$ paints reabsorbtion (referred often as simply absorption) remains constant during a photon travel in a waveguide before it is extracted. If such paint comprises phosphor additives or is a pure phosphor, some of the light will be converted to a different wavelength and will be absorbed at a different exponentially decreasing rate in sequential MIRs. A quantum conversion efficiency of phosphors (typically 0.9) can be straightforwardly accounted by simply adjusting device EQE by this factor. A ratio of scattering/absorption coefficients might be different for a particular extractor and will be considered therein.

Accordingly, any reference to Extractor made herein can refer to both passive, active or mixes subclass, if not otherwise stated. Consequently, all disclosed embodiments apply instantly without any modifications to any extractors.

In all conventional techniques used in LEDs, fluorescent lamps and other discharge sources (as well in paints etc) including their various modifications the first incident flux transverses a phosphor medium across its full thickness (e.g. in a vertical direction) including a blue component, which should not be converted. On the contrary, the disclosed hereinbelow optical architecture enables an active extractor deposition, which differs radically from this conventional technique, as the waveguide-contained flux propagates parallel to a converting extractor layer. This approach philosophy brings a number of improvements, which are even theoretically not possible with a traditional "conformal vertical stack" packaging approach:

A layer can be placed at any position along the waveguide, i.e. at a desired distance from the primary source completely eliminating die reabsorbtion losses and improving the thermal regime of phosphor operation.

Inter-phosphor reabsorbtion losses (for multicolor blends) can be significantly reduced by a better component containment reducing mutual photonic interaction (i.e. radiation exchange) between different downconverted wavelengths. The latter is also true for intra-phosphor (phosphor of the same type) radiation transfer.

Phosphor quantity can be significantly reduced by an induced photonic recycling (IPR) of the flux, so that in a steady state the probability of photon trapping is significantly increased simultaneously with a lower mutual interaction, i.e. secondary mutual re-radiation characteristic for densely packed turbid media.

Blue component can be directly outcoupled from a die without unnecessarily going through a lossy phosphor layer.

Relatively low-luminance visually comfortable lighting devices at a reduced phosphor quantity.

Better color uniformity with thinner layers.

Practical elimination of phosphor thickness and "crowding" (flocculation) problem resulting in a relaxation of phosphor tolerance requirement and cost.

More consistent LED lumen and color parameters and higher yield of higher end products.

One can conclude from the aforementioned analysis that, with a blue or UV light-emitting diode and such downconverting yellow phosphor, cool and warm white light can be produced. Use of two-component yellow-red phosphor blend improves color rendering (CRI) so that higher CRI comparable to tri-phosphor fluorescent lamps can be produced. Depending on a phosphor composition a wide color gamut of more saturated colors (e.g. green, amber, yellow and continuous spectrums can be produced as well. For pcLEDs there are two additional factors to consider in addition to chip reabsorption (considered in U.S. Pat. No. 7,001,058):

(a) External Quantum Efficiency (EQE). As already noted above, phosphor layer reradiates a downconverted light omnidirectionally and quasi-isotropically, so that at least 55 percent of it is radiated in a backward hemisphere toward chip bonding bottom. In fact in a steady state this recycled flux is much higher due to an additional (i.e. secondary) inter- and/or intra-phosphor scattering ((Gurevitch-Gershun-Kubelka-Munk type of radiation transfer in a strongly turbid media). It propagates through its active layer and other structural elements and is reflected back to the phosphor by its back reflector (e.g. DBR with less than an ideal reflectance). Since chip's reabsorption of a downconverted light is relatively high compared to reabsorption of its own blue radiation (so-called extractor reabsorption losses or residual flux losses), such flux MIR recycling results in a highly elevated efficiency loss and in chip overheating.

Phosphor reabsorption as a dominant loss mechanism has not been treated in detail previously, although it has been recognized as a "serious problem." Phosphors and dyes in general do not have unit quantum yield, i.e., some excitations are lost through radiationless relaxation. A typical number for a phosphor quantum yield is 0.9. Once a photon has been reabsorbed, nonunit quantum yield reduces the probability that a photon will be reemitted. Typical gross features of the absorption and fluorescence spectra are shown in FIG. 1

Clearly, a sizable portion of the fluorescence spectrum overlaps strongly with the absorption spectrum. Generally, the smaller is the gap between the excitation and downconverted spectrums (e.g. yellow-red vs. blue-red) the larger is the reabsorption. With this notion it is to be expected that for multicolor phosphor blends the downconversion losses are sharply elevated, since, for example, part of the yellow converted radiation will be reabsorbed more strongly—e.g. by a second (red) phosphor—and vice versa, these extra losses adding up to losses in the blue-yellow and blue-red conversions. As photons experience MIRs these secondary interactions may exhibit quasi-exponential nonlinear efficiency loss. They are also bound to cause higher color variations (considered next), since the reabsorption is wavelength dependent. Thus, one can predict that yellow and red and component will be more saturated for thicker layers. In a limiting case of high secondary reabsorption rates the final spectrum will degenerate into quasi-monochromatic with blue, yellow and red narrow emission lines, severely jeopardizing CRI.

(b) Color variations at different viewing angles. These were already considered above. For warmer colors (CCT of 3000-5500K) thicker and/or two component phosphor blends should be used to trap most of the blue radiation. An optical path of blue photons across the phosphor layer and multiple interreflections (MIRs) of downconverted flux on phosphor particles increases at higher angles to the normal and may cause perceptible variation of color hue, saturation and luminance. The latter imposes more strict binning control leading to higher manufacturing costs and increased demand to phosphor quality (granular size, uniformity, thickness).

As a specific example of alleviating reabsorption and color constancy problem, we consider one known solution, disclosed in U.S. Pat. Publication No. 5,962,971 by Chen, published in October 1999, and we note its deficiencies below. FIG. 3 from Chen is reproduced herein as FIG. 2 in the present application. A UV chip 1 is located in the concave V slot 2 (e.g. cup reflector), filled a resin encapsulator with phosphor layer 4 spaced at some distance from 1. Chen was not concerned with reabsorption losses and aimed at producing a more uniform white light of better color quality, which is uniformly distributed within a wider projection angle. Nevertheless, Chen's system has a number of inherent deficiencies, which are characteristic of also other, more recent, devices:

Obviously a larger phosphor quantity (proportional to its area) has to be used to convert a required Blue fraction.

The phosphor is positioned conformally with the chip. Our use of the term "conformally" includes all cases when a phosphor layer or its projection and an emitter lie in the same or parallel planes—sometimes the term is used in a more narrow sense for a case of zero spacing).

Primary radiation transverses the phosphor, as usual, crosswise, so that both converted and unconverted primary radiation is recycled backwards, causing enhanced reabsorption losses in the source.

Thermal load on phosphor is not completely eliminated.

It is therefore another object of the present invention to provide an innovative structure for LEDs with wavelength-converting agents which can overcome the drawbacks of conventional LED products and generate We can now summarize the requirements for an optimal lighting device that integrates a LED die with secondary optics, to obtain the highest efficiency for a given set of boundary conditions and production considerations, as follows:

The LED chip should be optimally shaped to reduce self-reabsorption and provide a starting point for a design of primary and secondary optics Preferably any LED optics should be in a direct optical contact with a die with no intervening air interface.

The extracted flux should be contained within a specified angular cone (e.g. a forward hemisphere) and have a specified intensity distribution or luminance with a minimal fraction of light spillover outside a defined cone.

Preferably the optics should rely on TIR systems having no reflection losses.

Preferably for maximally efficient devices the primary-secondary optics should eliminate any flux recycling on a primary source.

Maximally compact devices with active and/or passive extractors should preferably include a single or multiple IPR flux recycling cavities optimized for minimal reabsorption losses.

Optics for pcLEDs should provide a possibility of phosphor positioning that results in a minimal recycling of down-converted flux through the die, as well as intra- and inter-phosphor radiation exchange, while maintaining a possibly high device luminance and desired directionality of extracted flux (i.e. small extraction aperture directing most of the extracted flux within a specified angular cone. It should also aim at color uniformity and cost reduction by reducing to a minimum a required phosphor quantity and/or thickness of its layers and easing the tolerances on its quality. In practice this calls for a special non-imaging optical "relay" (or optical "teleportation") systems similar to a crater (disclosed herein-above), which builds the smallest possible, or optimally configured, two- or three dimensional virtual image of the chip's emitting surfaces at a specified spatial location, preferably at the maximal vicinity of the chip.

The Solution should be scalable, i.e. enable easy construction of high power multiple LED arrays.

For backlighting applications, as well as for other applications requiring thin profile and relatively low and uniform luminance (e.g. some general lighting systems and LCD backlights), the optical system should have an efficient maximally thin side emitting coupler similar to a crater (disclosed hereinabove), to inject the light into thin light guides with distributed extractors.

Passive and active extractors should be optimally distributed to produce a uniform (or any specified) luminance, while maintaining low profile and high efficiency of flux extraction and downconversion.

Basically, the invention is of an apparatus to serve for display or lighting, comprising:

a wave guide with at least one edge and two faces, at least one of the faces including a doubly curved wedge light guiding arrangement;

at least one light source, coupled to one of the faces of the wave guide;

at least one passive or/and active light extractor, disposed integrally to one or both of the faces of the wave guide; and a reflector, disposed proximate to at least one of the faces;

wherein the light guiding arrangement has an inclination angle that diminishes as a function of distance from each of the light sources along both coordinate axes of the respective face.

In one embodiment the apparatus further includes a foconic coupler disposed between any of the light sources and the respective face of the wave guide.

In some configurations the apparatus is configured to serve as a backlight for a display device.

Any of the extractors may include a thin layer, a solution, a suspension or a compound of passive light scattering agents or of active, wavelength converting, agents, roughened surfaces or a mixture of any of these means.

The light source may include a ultraviolet, blue, white or tri-color (Red Green Blue) radiator, having a single or multiple escape cones.

In other configurations of the embodiment, the foconic coupler and the doubly curved wave guide form a symmetrical compound surface having multiple segments, with mutually different curvatures.

In one configuration at least two of the segments are hyperbolic; in another—at least one segment is hyperbolic and at least one other segment is elliptic.

At least one of the segments may include a reflector.

In yet other configurations of the embodiment, the foconic coupler and the doubly curved wave guide form an asymmetrical compound surface, having mutually different curvatures along different horizontal coordinate axes. In some of them the compound surface has multiple segments with mutually different curvatures along each of the coordinate axes.

In one of these configurations at least two of the segments are hyperbolic along each of the coordinate axes; in another—along each of the coordinate axes, at least one segment is hyperbolic and at least one other segment is elliptic.

In still other configurations of the embodiment the foconic coupler has a compound forward-extracting elliptic surface, forming an asymmetrical lens that has mutually different curvatures along different coordinate axes of the faces.

Alternatively, the foconic coupler may have a two-dimensional linear shape, formed by a translation of a constant vertical cross-section along a horizontal axis.

Alternatively again, the foconic coupler may have a truncated shape, with an apex having a planar, elliptic or hyperbolic surface, which may be transparent or possibly have a reflective layer.

In certain configurations the wave guide is substantially thicker in regions that are not in contact with the foconic couplers, thereby forming an Induced Photonic Recycling Chamber.

In another embodiment the wave guide has edges formed by coaxial spherical segments alternating with radial linear segments.

In yet another embodiment the light source is shaped as a tetrahedron with a vertical aspect ratio of between 0.5 and 3. The tetrahedron may be isosceles or may be a right angle tetrahedron, having a right angle base. It may, further, be truncated.

In still another embodiment the light source is shaped as a double right angle tetrahedron with a vertical aspect ratio of between 0.5 and 3.

In some of the embodiments any of the foconic couplers may be shaped as a tetrahedron; in some—they have a refraction index of between 1.5 and 2.4.

In certain configurations the foconic coupler is encapsulated in an inverted truncated tetrahedral lens, having an essentially larger size and an essentially lower refraction index.

In some of the embodiments the active extractors are deposited with a non-uniform two-dimensional density distribution. In certain configurations some of the active extractors differ from others in the wavelength of the emitted light and are deposited correspondingly in different regions of the wave guide.

In yet another embodiment the apparatus further comprises two additional wave guides, similar to the first wave guide, all three of the wave guides being arranged in a vertical stack, separated by air interfaces.

In another aspect, the invention is of a liquid crystal display device, comprising:

a liquid crystal display module; and a backlight structure, including:

a light source, a wave guide, including two faces, a foconic coupler disposed between the light source and a face of the wave guide, and a reflector disposed proximate to one of the faces of the wave guide;

In yet another aspect, the invention is of an apparatus for use with a radiation- or lighting device and comprises:

a radiation source with a refraction index $N_{em}$;

a plurality of dielectric materials with successively decreasing $N_{ex,n}$ ($N_{em} > N_{ex1} > N_{ex,2} > \ldots N_{ex,n} \geq 1$), first material being in optical contact with the radiation source and each subsequent material being in direct optical contact, without an air interface, with materials adjacent thereto, wherein the source and materials have a progressively increasing minimal projected surface area, scaled according to an Extraction Invariant, which is expressed as:

$$S_{ex,n} = S_{ex,n-1} * (N_{n-1}/N_n)^2$$

and $$S_{ex,n} = S_{em} * (N_{em}/N_{ex,n})^2.$$

BRIEF DESCRIPTION OF THE DRAWINGS

The invention may best be understood by reference to the following description taken in conjunction with the accompanying drawings, in which.

DETAILED DESCRIPTION

Although the invention will be described in connection with certain preferred embodiments, it will be understood that the invention is not limited to those particular embodiments. On the contrary, the invention is intended to cover all alternatives, modifications, and equivalent arrangements as may be included within the spirit and scope of the invention as defined by the appended claims.

Embodiment 1

Couplers for Different Refraction Index (N) Values

Figure 1:
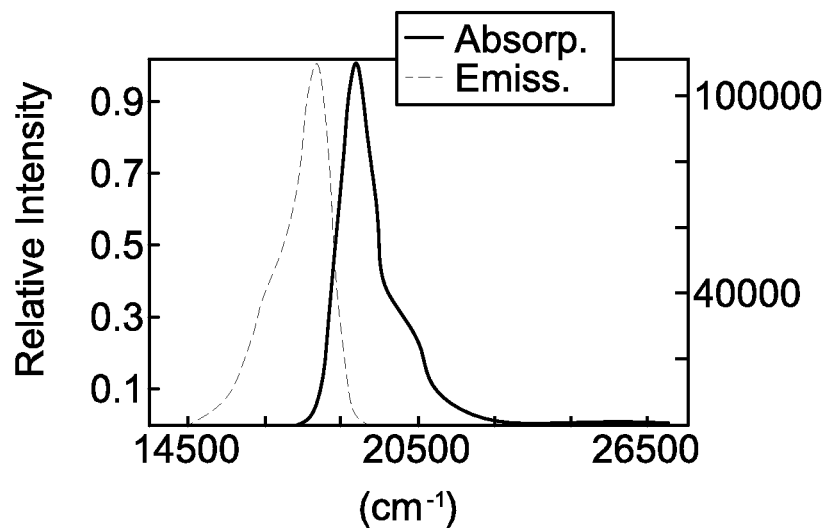
FIG. 1: Absorption and emission spectra of rhodamine 6G. L 1
Figure 2A:
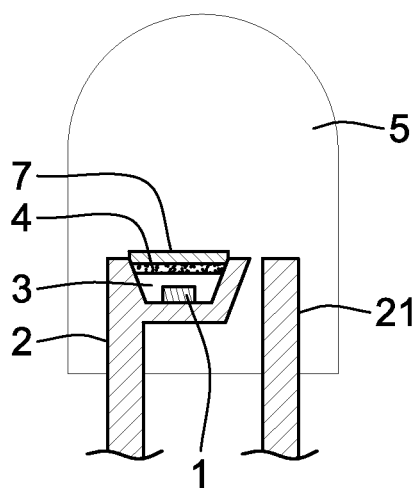
FIG. 2: Prior Art. White LED with Phosphor.
Figure 2B:
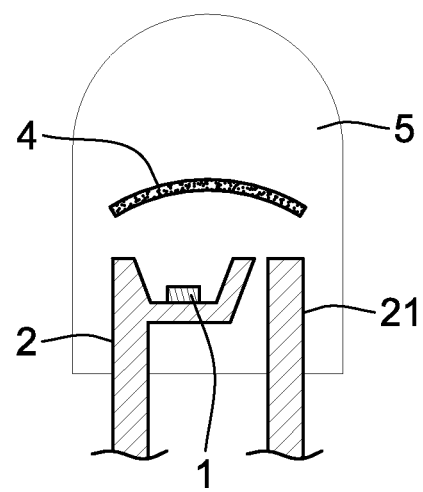
Figure 3:
FIG. 3: Foconic Couplers for different Refraction Index (1.49, 2.4, >>1)

FIG. 3 shows maximally compact hyperbolic couplers for refraction index values of 1.49, 2.4 and >>1 (e.g. metal minor reflector). For 1.2<N<2.5, vertical and horizontal dimensions of the coupler, $X_{max}$ and $Y_{max}$, decrease approximately as N(exp2) and its area (and consequently the possible flux density)—as N(exp4). For larger N there is only a modest effect. This fundamental conclusion has far reaching implications.

Embodiment 2

Optimal Apex Angle of the Crater in a Foconic Coupler

One should be aware of the practical issues related to a manufacturing complexity involved in a mass replication of a central miniscule concave portion of the crater with nearly vertical walls.

Figure 4:
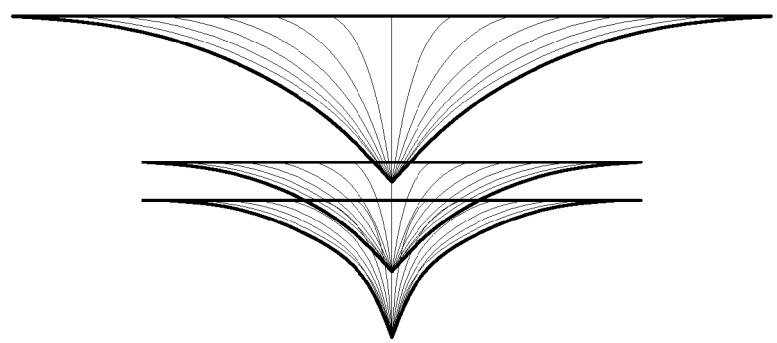
FIG. 4: Hyperbolic coupling section having different apex angles of 12-36 degs.

FIG. 4 depicts a hyperbolic coupling section having different apex angles. Smaller angles lead to a smaller device size, but they are harder to produce in mass replication. Preferably the apex angle should be 35-25 degrees.

Embodiment 3

Truncated Two-dimensional Couplers

Consider next a combination of two-dimensional couplers and a non-linear wedge (NLW), also termed SRS in the present context. They may be treated as a limiting case of asymmetric devices, described for example in U.S. Pat. Nos. 7,001,058 and 7,263,268 by Inditsky. Some powerful LEDs lamps are constructed by mounting multiple dies along a line, such dies forming a quasi-linear source. Using a three dimensional axially symmetric coupler designed for a maximal (X) source dimension would lead to an exceedingly large device. Secondly optimal three dimensional shapes are difficult to manufacture (as explained hereinbelow). For very long sources (i.e. having high X/Y aspect ratio) the light field is two dimensional and a length of a coupler should be equal to that of the source. However, modified two dimensional couplers can also be used for sources of any configuration, e.g. circular, square, small aspect rectangles etc.

FIG. 5 depicts a two dimensional hyperbolic coupler for a 1×24 mm 5 W LED strip. Its profile in YZ plane is identical to a rotationally symmetric coupler for 1 mm source. The coupler is generated by a translation of this profile curve along axis X. Importantly, it is longer than a source (X=34 mm) to reflect the side emitted azimuthal rays by TIR. FIG. 5B shows a similar coupler for a circular 2 mm diameter or 1.4×1.4 mm square sources. LID of two dimensional couplers is not azimuthally symmetrical (around axis Z). For sources with a higher aspect ratio more flux is directed along axis Y. Uniform FID (Flat Illumination Device) can be constructed by applying an optimal extractor distribution characterized by a cover factor (CF), as described in U.S. Pat. No. 7,001,058. FIG. 5C shows such CF distribution for a 6"×6" FID with a two dimensional coupler. Extraction rate is lower (appears darker) along a Y axis to balance higher irradiance along around this direction. Similar luminance equalizing effect can be obtained by using a two dimensional NLW instead of a planar SRC, considered in this example or a combination of both, as described, again, in U.S. Pat. No. 7,001,058.

Figure 5A:
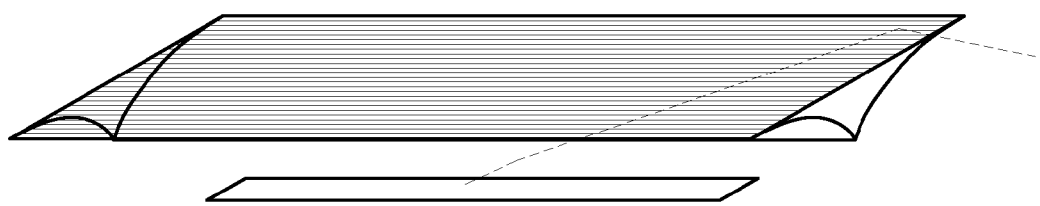
FIG. 5A: A Horizontally truncated two dimensional coupler for rectangular source
Figure 5B:
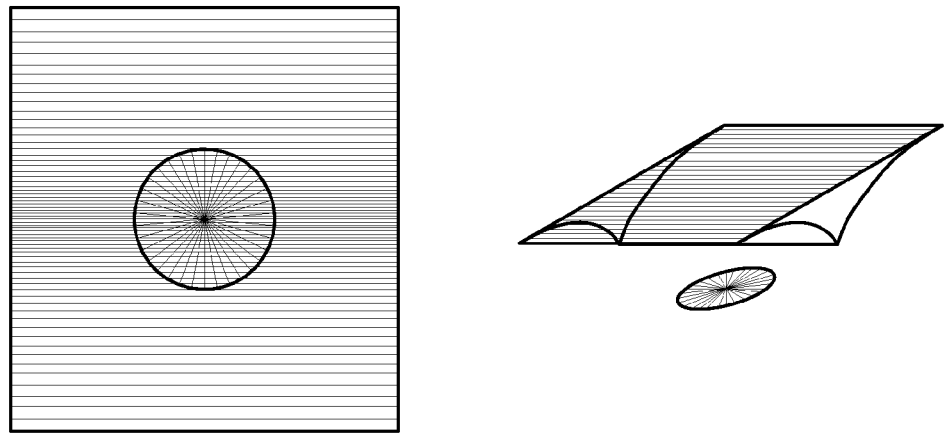
FIG. 5B: Horizontally truncated two dimensional square coupler for circular source
Figure 5C:
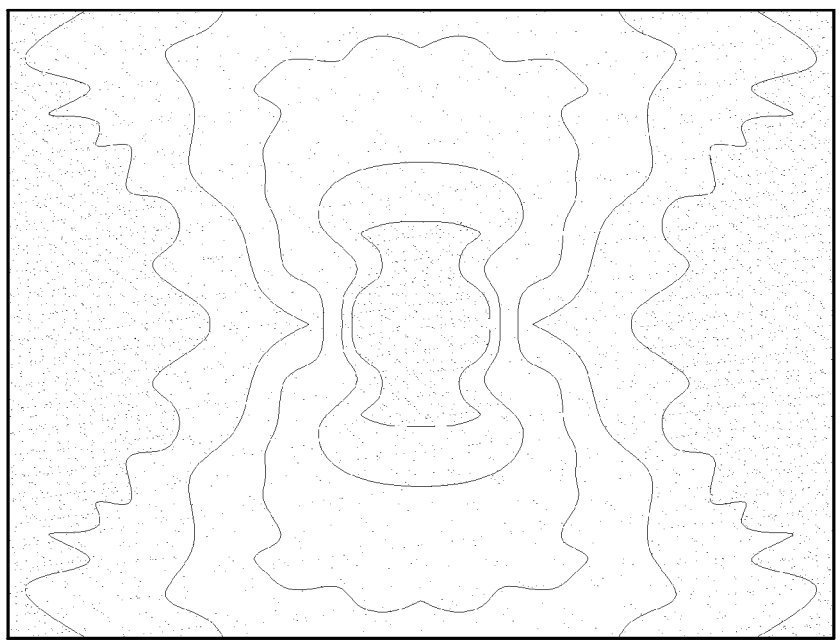
FIG. 5C: Extractor Cover Factor (CF) distribution for a 6"×6" FID with a two dimensional coupler
Figure 5D:
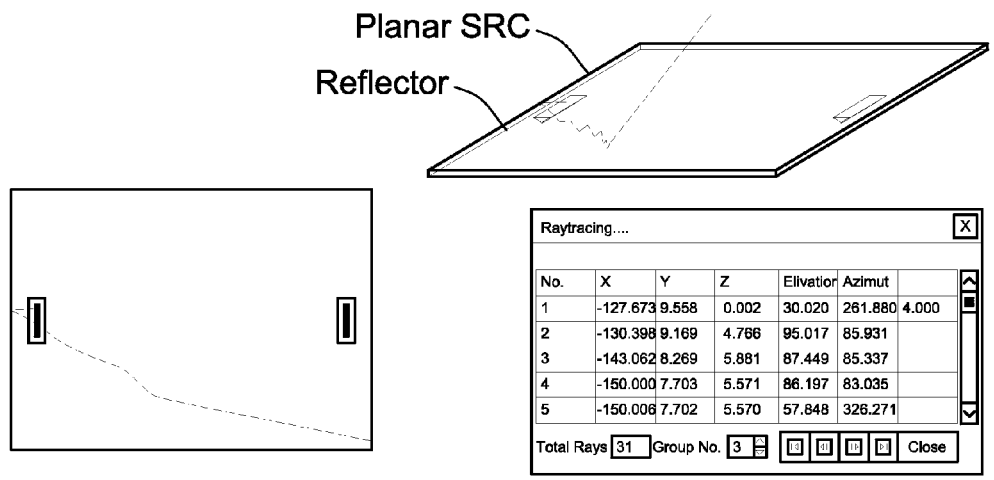
FIG. 5D: FID with two edge-proximal side couplers and planar SRC

A NLW can include any number of couplers arranged in a suitable (any) order, which may be formed integrally or implanted into NLW, as disclosed in U.S. Pat. No. 7,001,058 (FIGS. 16C-16D. FIG. 5D of the present disclosure depicts two couplers inserted along the vertical edges of a 300×420 mm (A3) NLW. In this example a small, preferably specular, reflector is proximate to the SRC's edge segment opposite a coupler. It intercepts a coupler-ejected flux and redirects it can onto a source until it is TIR reflected into a forward direction and is eventually ejected out of SRC, as illustrated by a sample ray. Thus the coupler-SRC and the edge-reflector form a useful IFR system.

Similar devices may be useful for "EXIT" signs and other devices, where a LED should allow simple wiring to power supply or a Crater should remain outside an active area to improve uniformity.

Figure 5E:
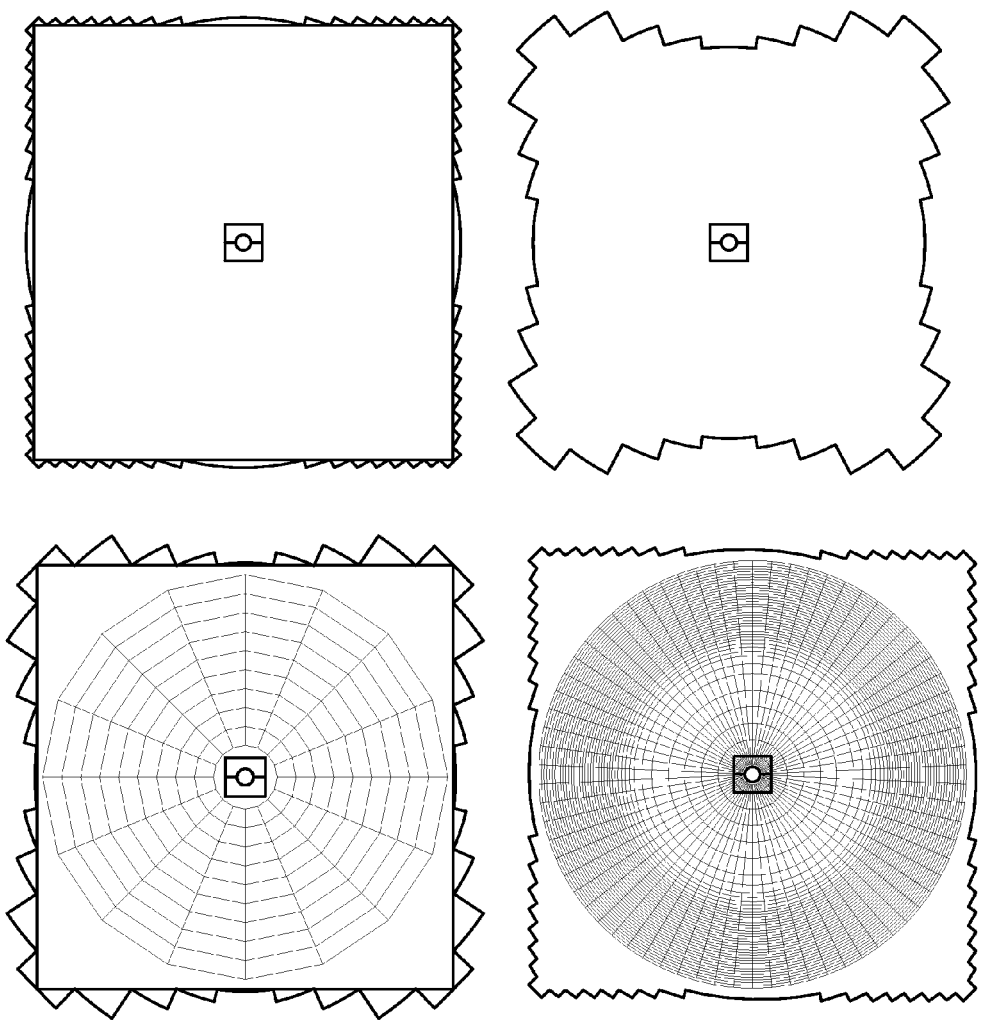
FIG. 5E: Doubly prismatic SRC with Fresnel-shaped edges and central foconic coupler (m.b. new subclaim)

FIG. 5E illustrates an FID with a planar SRC comprising microprismatic concentric extractors whose outer edges are specially shaped to provide better flux collimation, i.e. more narrow LID. The edges are formed by spherical segments connected by coaxial linear sections bearing some resemblance to a modified Fresnel lens. However its mode of operation is totally different. They intercept a residual flux reaching the edges in a first photon pass and reflect it back to the source along the same azimuthal direction toward the source. As a result, the directionality of groove extractors is preserved and remains nearly the same as in the first pass. Secondly, there is a full coverage of an active window, while in the case of a conventional rectangular shape the fill factor is 0.5 resulting in a sequence of black-white rings, which is a known deficiency of classical Fresnel optics.

Embodiment 4

Truncated Coupler

Figure 6A:
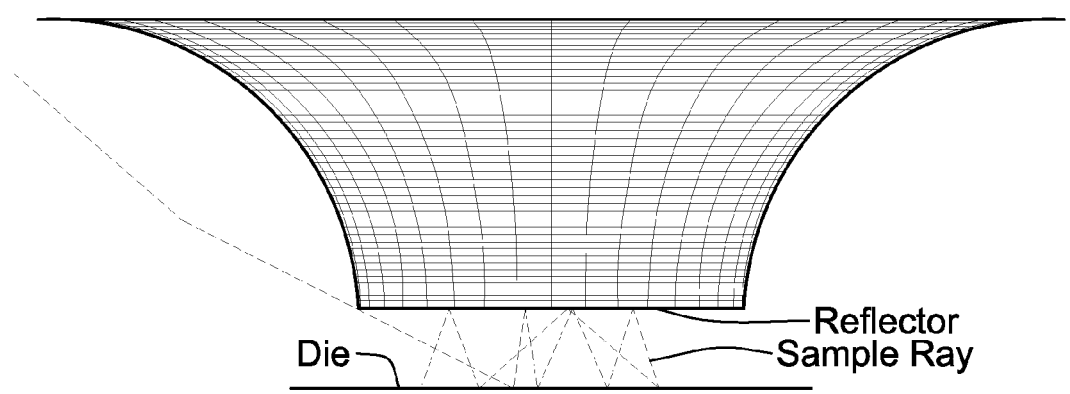
FIG. 6A: Truncated hyperbolic-elliptic foconic coupler

FIG. 6A depicts a compound hyperbolic-elliptic waveguide comprising a truncated hyperbolic foconic coupler with a flat apex section, which is a limiting case of either elliptic or hyperbolic profiles. In this embodiment section is a mirror reflector (e.g. 3M Vicuity OSR with 0.98 reflectance). It forms a recycling cavity with respect to a die by recycling a fraction of an incident die flux back onto the die until it is ejected after reaching an unobscured ring shaped tangential emitting area on a die's margin. A reflector-die distance $Z_{rd}$ has to be carefully selected for each particular spatial configuration size of an emitter to reduce emitter-reflector MIRs. This selection is governed by two design requirements: a) the recycled flux should reach an ejection aperture with a minimal number of MIRs; and b) it should not be spilled over a horizontal plane adjacent to the die, i.e. it should be fully contained within the die's area.

In different embodiments a flat segment may be either reflecting or transparent. It may have three principal functions—(a) to further reduce the profile thickness $Z_{max}$; (b) to effectively recycle a flux (emanating from a LED) and (c) to increase intrinsic source luminance by an induced recycling mechanism.

If segment is a minor reflector (e.g. OSR of 3M with 0.98 reflectance), it reflects an incident flux back onto the LED until it is ejected after reaching an nonobscured ring-shaped emitting tangential area on the LED's periphery. A reflector with a given flux trapping ratio $Z_R$ should be carefully selected for each particular spatial configuration of an emitter, to reduce source-reflector MIRs.

Figure 6B:
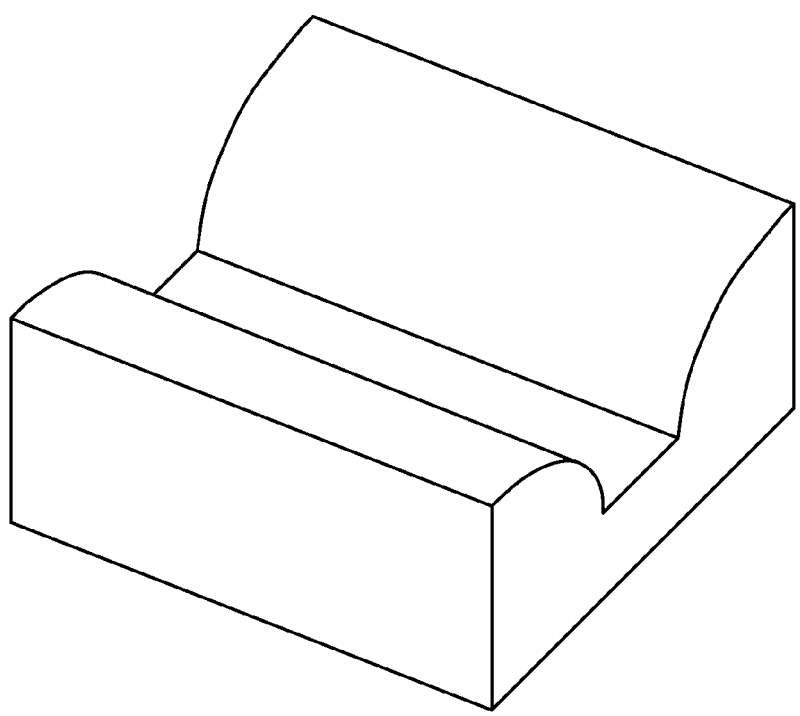
FIG. 6B: Truncated two dimensional hyperbolic-elliptic foconic coupler with linear strip source

A two dimensional truncated coupler is shown in FIG. 6B.

Figure 6C:
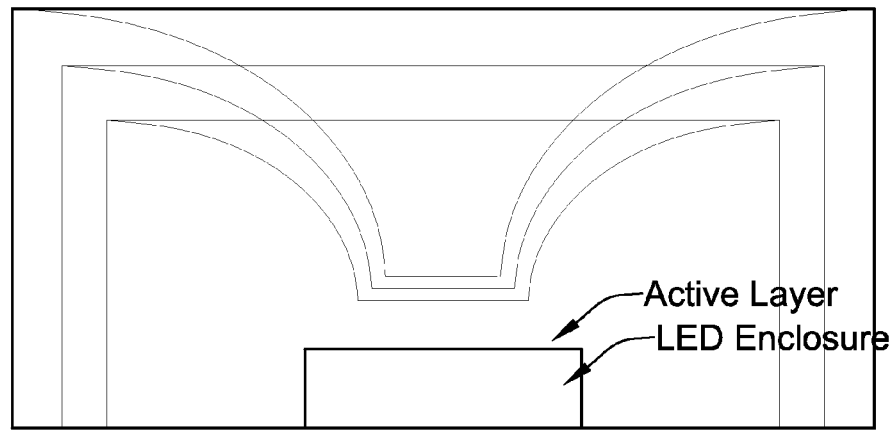
FIG. 6C: Truncated hyperbolic-elliptic foconic couplers with different flux recycling ratio

FIG. 6C illustrates couplers with a different recycling factor. By raising a flux recycling side-emitting profile can be significantly reduced with a corresponding device luminance increase. However, one should be aware of power efficiency drop.

Figure 6D:
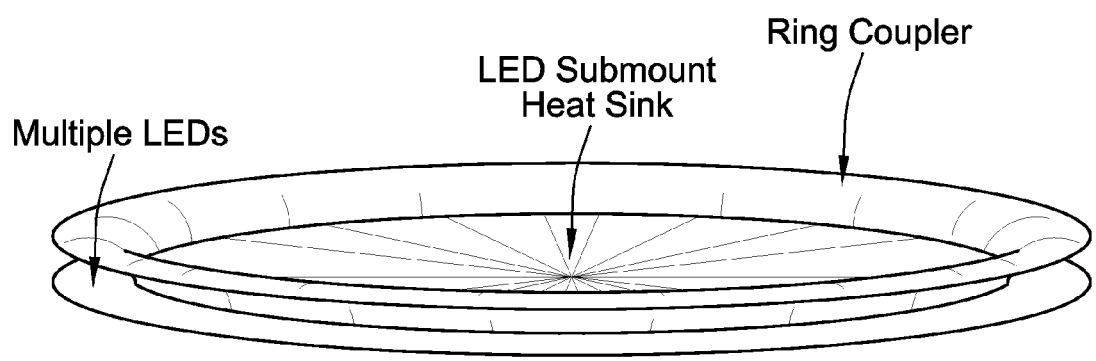
FIG. 6D: Truncated hyperbolic-elliptic foconic coupler for a ring-shaped source

FIG. 6D shows a configuration for a ring-shaped source.

FIG. 6E shows large Backlight (right) formed by a two dimensional tile array of multiple sources with integrated full Crater primary & secondary Optic.

Embodiment 5

Full Crater with Integrated Coupler-SRC

Figure 7A:
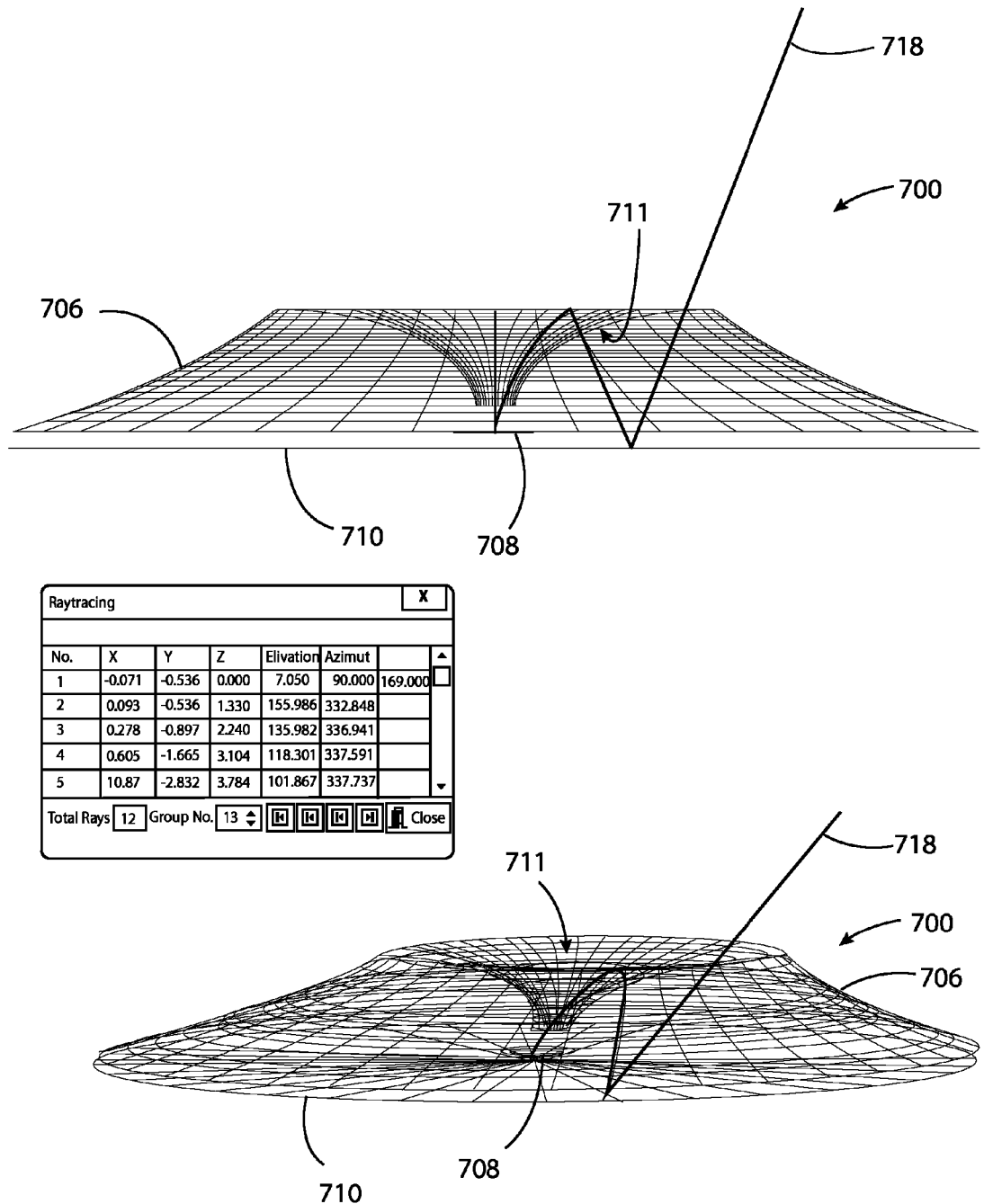
FIG. 7A: Truncated Full doubly hyperbolic-elliptic Crater (Coupler-SRC) having a central hyperbolic foconic (primary) truncated coupler integrally formed with a flux extracting wave guide with a doubly curved hyperbolic-elliptic upper face

FIG. 7A depicts a compound doubly hyperbolic doubly elliptic full crater waveguide 700 formed by a compound doubly hyperbolic doubly elliptic full crater waveguide, comprising four distinct sections: a truncated hyperbolic central foconic coupler 711 with a flat apex, extending into an elliptic hyperbolic SRC (crater's slope) (Sombrero or bagel) section 706, forming a concave elliptic-hyperbolic nonlinear (tapered) two dimensional wedge (NLW) with a specular reflector 710 preferably adjacent to a flat face of the wedge. Light source 708 is a conventional white LED with a conformal phosphor layer and 3×3 mm square (or disc) die directly coupled to a coupler 711. NLW is calculated to have Xmax≈20 mm, Zmax≈4.2 mm. A sample ray 718 illustrates an intrinsic complexity of radiation transfer. It undergoes 12 MIRs on all system elements before being extracted (including peculiar five "trailing" TIRs along the coupler, sometimes referred as "whispering" mode).

Figure 7B:
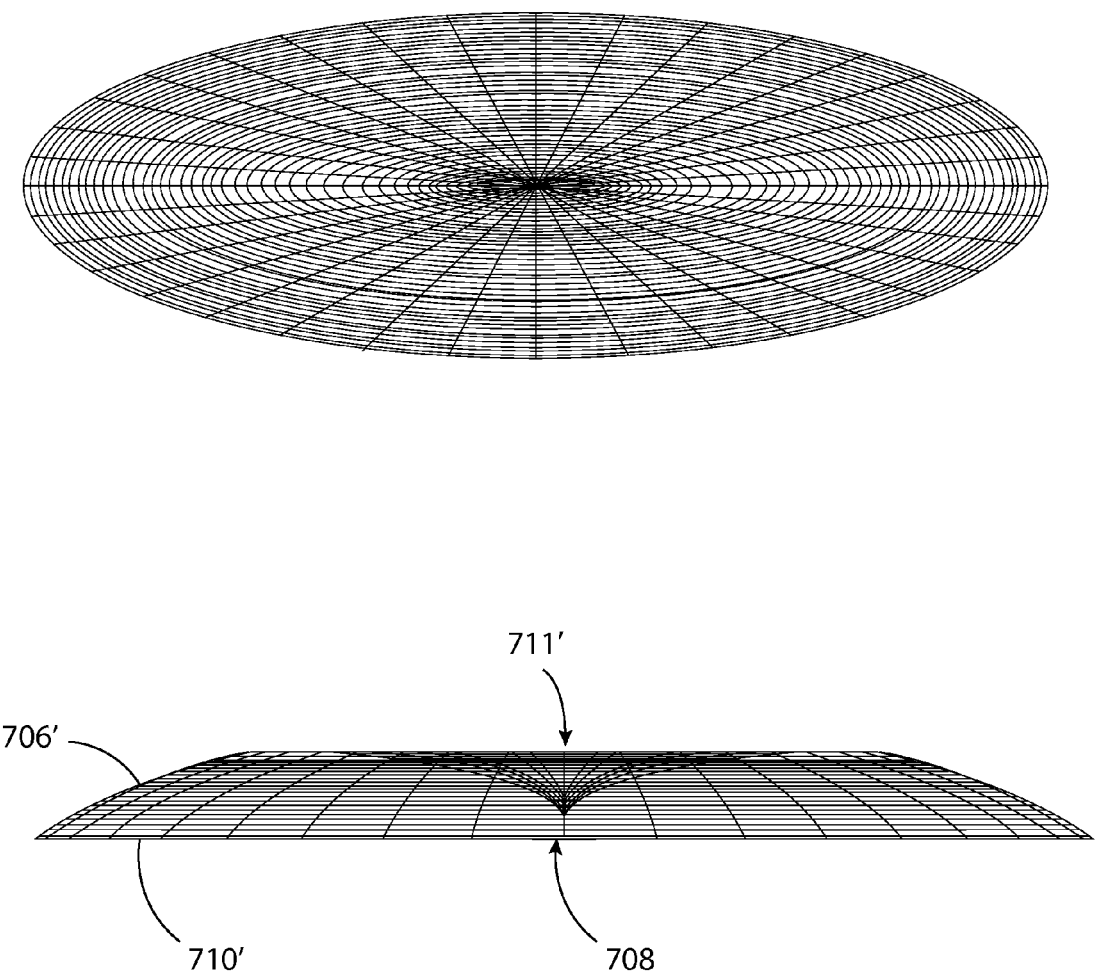
FIG. 7B: Full hyperbolic-elliptic asymmetric Crater (Coupler-DOPE SRC) having a central hyperbolic foconic (primary) coupler integrally formed with a flux extracting wave guide with a doubly curved hyperbolic-elliptic upper face

FIG. 7B depicts yet another embodiment with a central hyperbolic coupler section 711' extending into an asymmetric SRC (waveguide) section 706' forming a convex elliptic doubly-curved light guiding arrangement 700 generally having a smaller XY cross-section. Xmax≈16 mm; Ymax≈8 mm, Zmax=4.15 mm. It has a dual optical action by either TIR-reflecting and refracting incident radiation in down and up directions. With a reflector 710' adjacent to its backplane all the flux is directed in a forward (upper) direction.

Figure 7C:
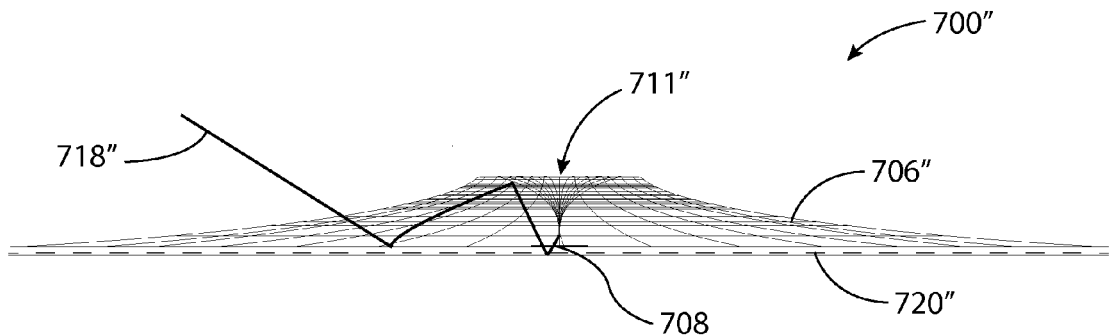
FIG. 7C: Full doubly hyperbolic-elliptic Crater (Coupler-DOPE SRC) with enlarged secondary section having passive/active extractors.
Figure 7C:
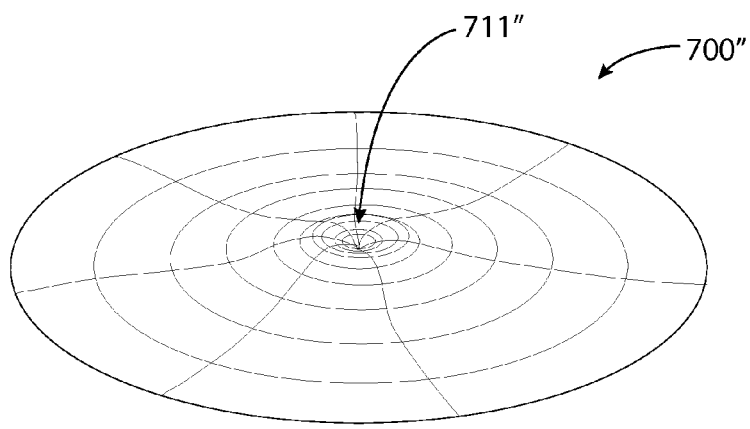

FIG. 7C shows a similar to 700 (FIG. 7A) multi-sectioned, doubly curved light guiding arrangement 700" with a coupler (hyperbolic) section 711" extending to a larger NLW secondary section 706", which can be used as an integrated LED backlight with a relatively low luminance. NLW can further include an additional light extracting passive or/active means or their combination such as scattering agents, surface roughening and/or downconverting phosphor blends 720". Light source 708 is a conventional white or blue LED with a 1.4×1.4 mm square die. NLW is calculated to have Xmax≈32 mm. With a 1 W source and 50 lm flux a module has an average luminance of ≈4000 nits compared to ≈4 Mnits intrinsic source luminance. The light guiding arrangement 706" fully encircles the light source 708, which injects light into the waveguide 700" in a first direction as indicated by the sample ray 718". The injected light gradually exits the light guiding arrangement 706" in different secondary directions after undergoing multiple total internal reflections within the light guiding arrangement 706". The light guiding arrangement 706" has a thickness that diminishes as a function of distance from the light source 708 along both coordinate axes of the respective faces as described above.

Figure 7D:
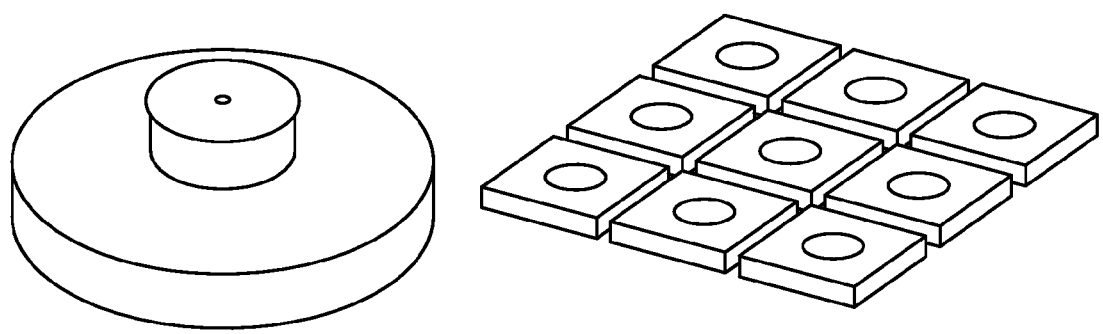
FIG. 7D: Large Backlight (right) formed by a two dimensional tile array of multiple sources with integrated full Crater primary & secondary Optics

FIG. 7D shows a multiple tile array of craters with planar SRC forming a large area ultrathin FID. Extractors have a reduced density to allow 50-80 percents of the flux to "leak" into four adjacent sections. So induced flux inter-tile exchange has two practical benefits. It masks the difference between individual LEDs and reduces binning tolerance. Secondly, it acts as an effective color mixer and enables a use of separate R, G or B LED in each cell, having reduced reabsorption losses of phosphor blends and adjustable CCT.

Figure 7E:
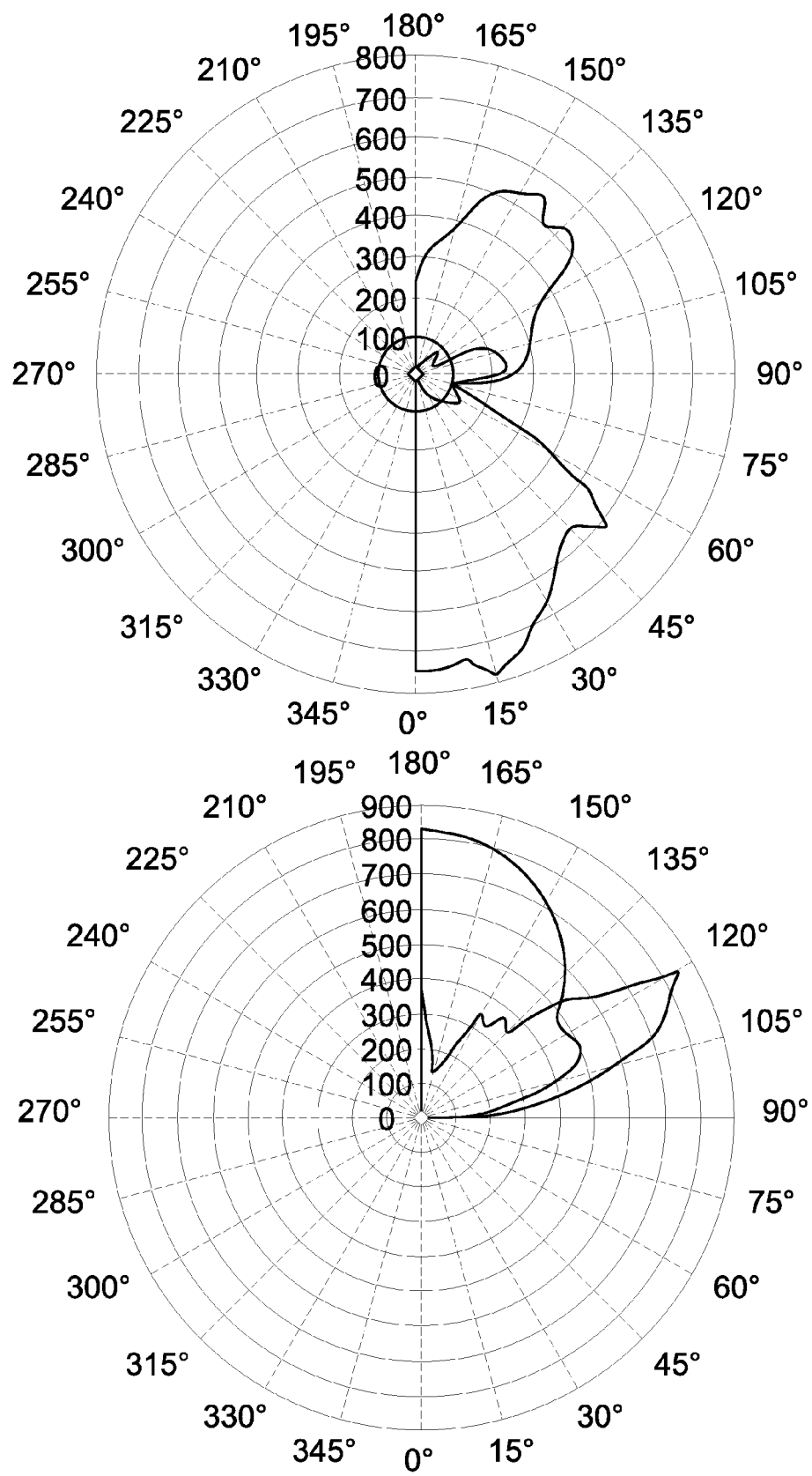
FIG. 7E: Light intensity distributions (LID) of craters shown in FIGS. 7A, B

FIG. 7E shows Light intensity distributions (LID) of the craters shown in FIGS. 7 A, B—with and without scattering extractors. With no extractors a distribution maximum is skewed to 120 degrees (60 deg. off-axis) and approaches an optimal one to insure illuminance uniformity in a far field (so-called $1/\cos^3$ type distribution). With extractors LID becomes less directional (quasi-lambertian) with 93-100 percents of the flux ejected upward.

The various embodiments considered hereinabove can thus be used to provide optimal FIDs for wide ranging applications requiring adjustable luminance and LID without a need for any additional glare restricting and flux redistributing secondary optics. It may, furthermore, be concluded that, by changing the SRC's curvature and using additional extractors with tuned absolute values and relative CF distribution, a device with an optimal thickness, horizontal dimensions, luminance and LID can be constructed.

Embodiment 6

Full Doubly Hyperbolic Crater (Coupler-DOPE SRC) with Active Extractor

Figure 8A:
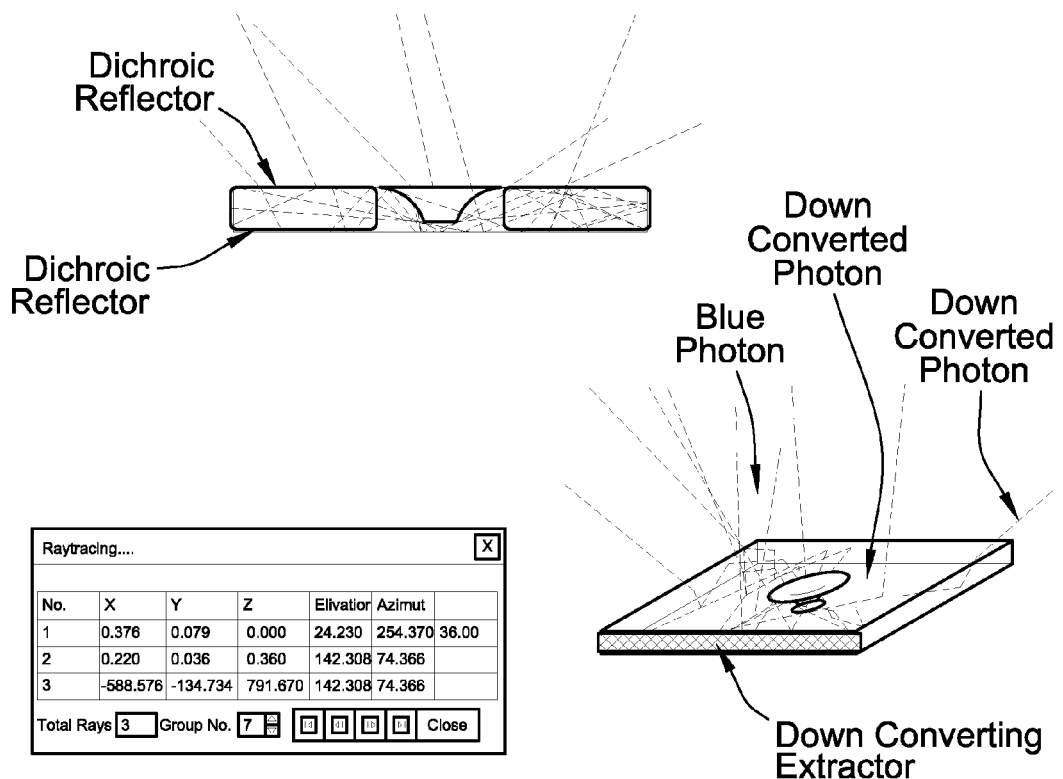
FIG. 8A: Full hyperbolic-planar Crater (Coupler-DOPE SRC) with Active DOPE Extractor

FIG. 8A illustrates a case when a downconverting phosphor (or compound etc.) is deposited non-conformally, i.e. not adjacent to a die, but in a NLW waveguide. The apparatus is identical to one shown in a previous embodiment with one modification: coupler is truncated by a transparent flattened apex section to allow direct extraction of a specified fraction of a primary Blue radiation from a die. Similar to passive extractor a phosphor can be a layer adjacent to NLW face(s) or a compound of small particles distributed in bulk SRC waveguide, which in this case performs also as a binder. A fraction of Blue component will also be ejected though the hyperbolic NLW. For lambertian source 60 percent of the Blue incident on a flat portion is recycled back onto a die. While this constitutes only a small fraction of the total flux there are a number of ways to totally eliminate recycling losses, as described in U.S. Pat. No. 7,001,058, by Inditsky, incorporated herein by reference. The coupler can be made shallower to allow some Blue radiation to be outcoupled directly before entering into SRC. Alternatively, the SRC can be modified to have a specified thickness $Z_{min}$ forming a vertical edge on its circumference in order to eject a specified flux fraction, which is proportional to $Z_{min}/Z_{max}$ ratio. A truncated coupler is generally easier for overmolding and other mass encapsulation techniques.

Figure 8B:
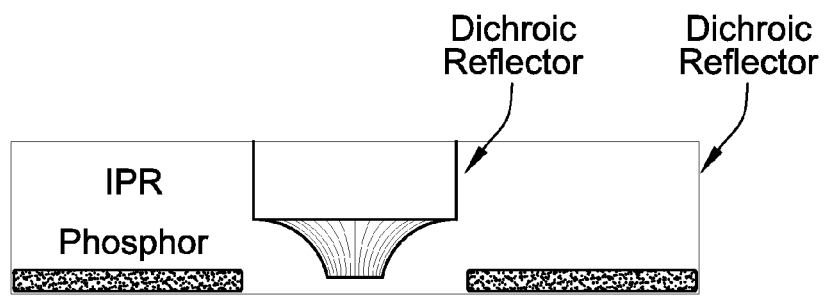
FIG. 8B: Full hyperbolic planar Crater with IPR wave guide.

Sample rays illustrate a highly effective IPR chamber (cavity). The maximal IPR factor implemented in a planar SRC with edge reflector is two, since photon is allowed to make only two passes along SRC in forward and backward horizontal directions, if it is not allowed to return to a primary source. The latter means, that a total phosphor quantity (i.e. concentration×volume=weight) can be reduced by the same factor 2. IPR factor can be enhanced by covering NLW faces by a dichroic reflector with a blue cutoff selectively reflecting blue component. Phosphor quantity can be further reduced by making SRC thicker than a coupler's height and preferably covering its edges by dichroic reflectors, as shown in FIG. 8B. One can further reduce the layer thickness or concentration by depositing it over larger SRC surface. The thickness of such layer is Ssource/Ssrc/RAR, that is it can be made order of magnitudes thinner than a conformal one. As explained hereinabove this has two major benefits: smaller phosphor reabsorption losses, better color constancy of the device and relaxed tolerances on phosphor quality (particle size and uniformity). Since Decoupled extraction of blue and downconverted components produces two lambertian sources their mixture in a Far Field (10 times device size) will have enhanced color homogeneity. With ultralow phosphor concentration having almost no scatter and absorption the device is transparent to an ambient lighting and has a special "see-through" characteristic. In an off mode it appears transparent and turns into a bright light source when activated.

Embodiment 7

LEDs with Multiple Escape Cones (MEC)

Figure 9A:
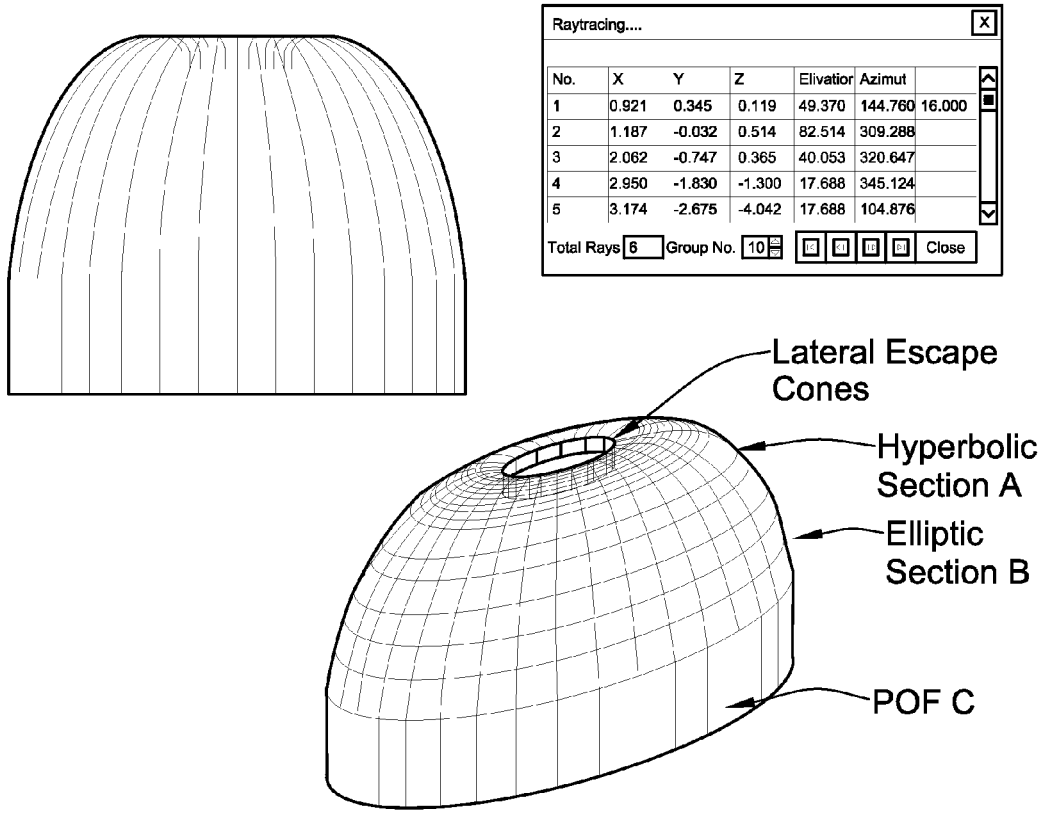
FIG. 9 A: Hyperbolic-elliptic TIR coupler for a die with five escape cones.
FIG. 9B: Hyperbolic-elliptic TIR coupler for a die with six escape cones.
FIG. 9C: TIR and TIR-reflector couplers
FIG. 9D: Asymmetric (free-form) forward-extracting outcoupling lens with dual TIR-refracting action

Consider next couplers for MECs sources described in greater detail hereinbelow. FIG. 9A shows a four-sectional TIR coupler for a five-cone chip with a vertical AR of 0.4 designed to directly inject flux into a cylindrical POF C (i.e. NA=1) or into an edge-coupled FID shown in FIGS. 6E-6H and 12A-12B (of parent). In this case a foconic coupler has two separately calculated principal sections. Upper hyperbolic-elliptic segment A intercepts an upward side-emitted flux and is followed by a compound elliptic segment B intercepting downward flux emitted through both side- and front escape cones. All reflected flux is contained within a critical TIR angle of a POF waveguide C and is coupled to an exit aperture of the foconic coupler. The POF and/or the non-linear wedge can additionally include passive and/or active extractors (as described in greater detail in the Parent application). It has been discovered that expanding elliptic opto-couplers, similar to segment B, are less effective for extracting flux directly into air; with regard to embodiment 8 below there are disclosed more suitable solutions for this case.

The calculation procedure for multi-segment couplers deserves further discussion, as it cannot be accomplished by conventional methods of non-imaging optics, which always consider a "one-piece" system having a single focal point. In our case there are two different sections having two distinct focal points on each escape window. Consequently there is a need to concatenate (or compound) differently curved segments; the starting point of each segment (defining its focal length) should correspond to an end point of the preceding segment. An interface between two segment should preferably be smooth i.e. have a continuous first derivative and in some cases also a continuous curvature (second derivative), which is known to be a precondition for obtaining smooth LID with no secondary peaks. The design is further complicated for asymmetrical systems, like a two dimensional NLW, which require smooth curvature gradient along two principal planes along elevation and azimuth directions. Such free-form optical system requires new iterative multistage design techniques, not offered by any existing software or described in theoretical literature.

Table 1 Spatial Angular Reflection function for synthesizing multi-sectional Crater wave guide.

| $\varphi$, ° | $\alpha$, ° |
|---|---|
| Hyperb. section A (0°-42°) | |
| 0.00 | −83.62 |
| 6.00 | −77.62 |
| 12.00 | −71.62 |
| 18.00 | −65.62 |
| 24.00 | −59.62 |
| 30.00 | −53.62 |
| 36.00 | −47.62 |
| 42.00 | −41.62 |
| Hyperb-ellip. section A (42°-90°) | |
| 48.00 | −35.62 |
| 54.00 | −29.62 |
| 60.00 | −23.62 |
| 66.00 | −17.62 |
| 72.00 | −11.62 |
| 78.00 | −5.62 |
| 84.00 | 0.38 |
| 90.00 | 6.38 |
| Ellip. section A (90°-142°) | |
| 90.00 | 16.38 |
| 96.00 | 22.38 |
| 102.00 | 28.38 |
| 108.00 | 34.38 |
| 114.00 | 40.38 |
| 120.00 | 46.38 |
| 126.00 | 52.38 |
| 142.00 | 58.38 |

Figure 9B:
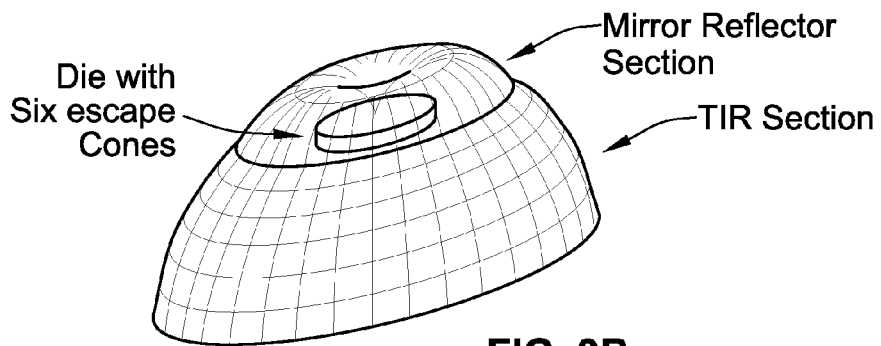

FIG. 9B depicts an exemplary embodiment of a five-segment forward extracting coupler, which collects flux from all six escape cones, including the die's backplane. Upward flux is intercepted by an additional upper principal segment D, formed by a hyperbolic minor reflector. Segment D can also serve as an improved heat sinking LED submount. For high power LEDs, the cavity can be filled with a transparent heat conducting material. The use of a mirror reflector enables to considerably reduce the device size. For a 1.414×1.41 mm die $X=3.5$; $Z=4.25$ $(1+3.25)$ (rel. $4.95\times 3z$)

Normalized overall dimensions are 5(X)×3(Z) and can be further reduced by allowing some flux recycling on the source.

Figure 9C:
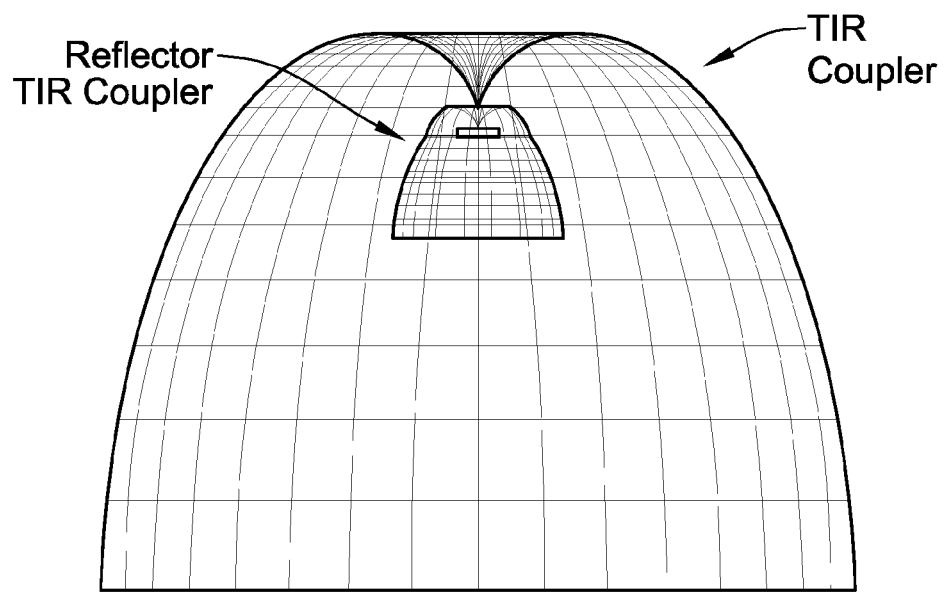

FIG. 9C shows relative dimensions of TIR and TIR-reflector couplers. This coupler is of special fundamental significance, as it provides a maximally compact, possibly ideal, LED primary optics, totally free of reabsorption losses, i.e. having EQE=1. No such practical systems have yet been attempted realistically.

Figure 9D:
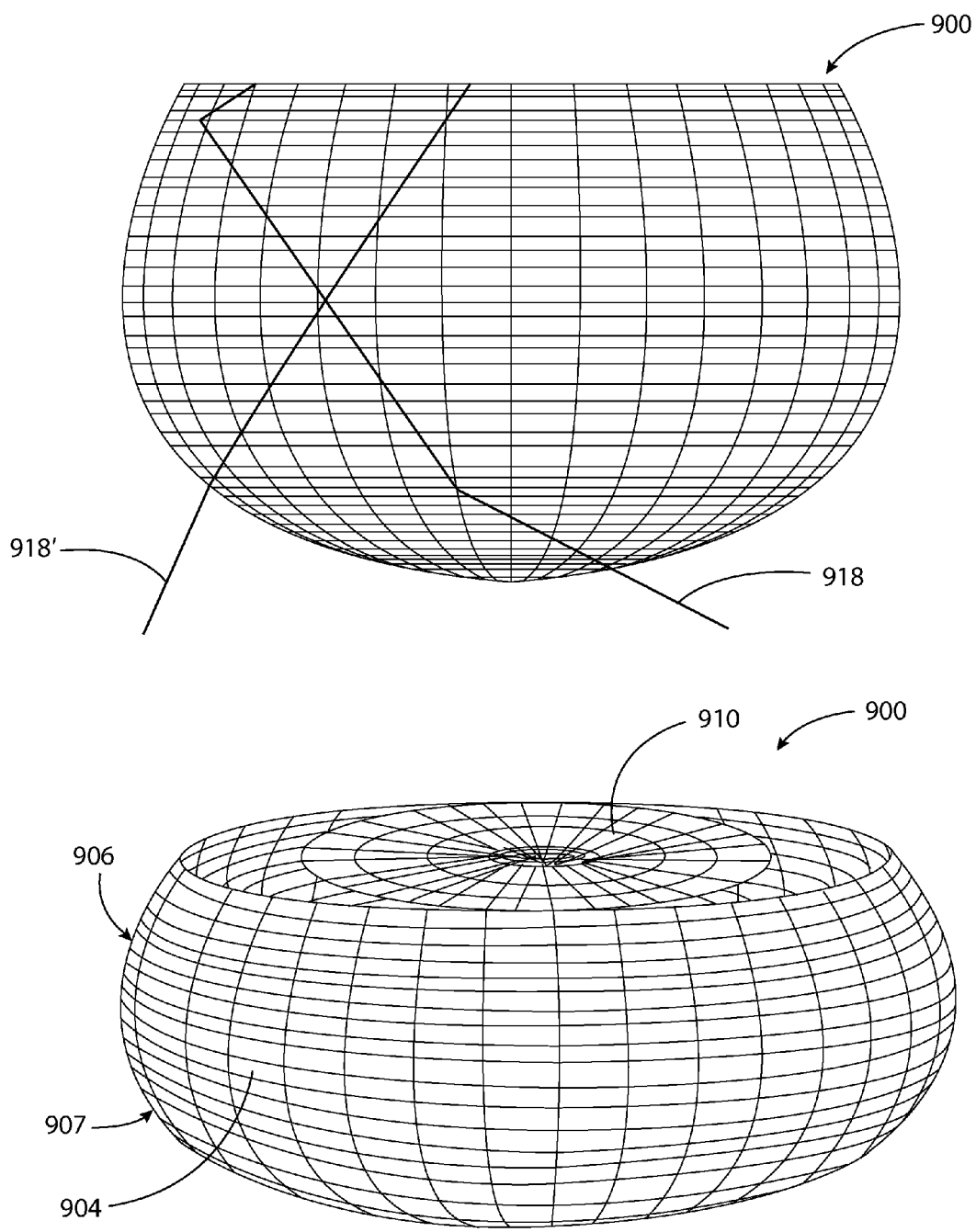

FIG. 9D shows a forward extracting free-form elliptic asymmetric coupler doubly-curved waveguide 900 directly coupled to a circular LED source 910 having a dual TIR-refraction action with rays ejected either by direct refraction or by multiple TIRs. The outer doubly-curved face 904 of the waveguide 900 includes at least two elliptic sections 906, 907 with mixed TIR-refraction and pure refraction action. The injected light gradually exits the light guiding arrangement 904 in different secondary directions (seen by the two sample rays 918, 918') after undergoing multiple TIR.

Embodiment 8

Sources with Multiple Escape Cones (MEC) and Forward Extracting Optocouplers

It is well known in the art that LED reabsorption losses can be reduced by using dies with MEC, whereby a larger portion of photons generated in a planar active layer is ejected in addition to a front escape window also through vertical sides of a semiconductor layer. With a typical layer thickness of less than ~100 microns this EQE increase is smaller for larger chips (e.g. 2×2 mm). Larger side cones can be formed by a growth substrate, such as sapphire, SiC, or GaAs, acting as a waveguide with side ejection. Parallelepipeds have limited extraction efficiency and other shapes (so called mesa-structures), such as full or truncated hemispheres, cones, pyramids, inverted truncated pyramids (TIP) are known to be more effective.

Similarly to a die, one can use shaped encapsulator to reduce flux recycling on encapsulator-air interface. There is a large number of different chip shapes with smooth, roughened or partially roughened faces. Each chip can be encapsulated in a different primary optics encapsulator coupled to a secondary optical system, resulting in a virtually unlimited number of possible solutions. An optimal solution for such a complex system is impossible without a deeper understanding of fundamental principles and invariant relationships of general light field theory—which has not been dealt by solid state scientists so far. Based on these principles one can, at this initial stage, outline a most promising approach.

We next postulate a new general Extraction Invariant (EI) representing a fundamental characteristic of the light field. If flux recycling back onto the source is to be avoided:

$S_{ext} \geq S_{em} \times (N_{em}/N_{ext})^2$, where $S_{em}$ and $S_{ext}$ are photon generating and extraction areas, respectively; $N_g$ and $N_{ext}$ are N of a source and source and its encapsulator For a lambertian primary radiator all extraction surfaces should preferably also be uniform lambertian radiators with a luminance (radiance) $L_{ex}=L_g/(N_{em}/N_{ext})_2$.

EI is a full invariant and holds for nonlambertian emitters, e.g. LEDs with photonic matrixes etc. In a latter case a correction "form" factor for each non-lambertian emitter has to be added.

EI sets a thermodynamic limit for the smallest size of an ideal extractor without defining its exact geometrical shape, luminance distribution and spatial distribution of extracted flux. Once an optimal general shape is found it can be subjected to a final optimization by painstaking numerical simulations, determining characteristics of optimally shaped and roughened extractors having a zero flux recycling.

Let us further introduce an associated new parameter, termed GEAR: generator-emitter amplification ratio, defined as a ratio of the corresponding areas of the total outer photon extracting surface and the active photon generating layer. For an ideal extractor:

$$GEAR = S_{ext}/S_{em} \geq (N_{em}/N_{ext})^2.$$

It is important to understand that EI principle can be applied integrally or individually to any emitter, coupler and secondary optics array or to each of its components. Thus, for an InGaN die immersed into a plastic encapsulator $N_g=2.4$; $N_{ext}=1.5$, and a minimal total flux extracting surface area of such a die should be 2.56 times larger $S_{em}$. Similarly, for an encapsulated planar die GEAR=2.25, that is encapsulator extracting surface should be 2.25 larger. If one wishes to extract all the light from the die into air GEAR=2.56× 2.25=5.76, i.e. a final extraction area should be at least 5.76 times larger than photon's generating area.

Figure 10A:
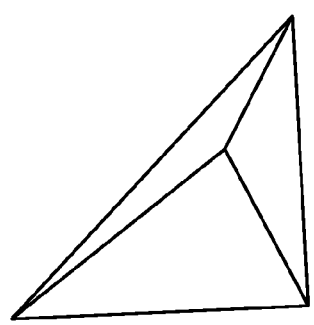
FIG. 10A: Regular Tetrahedron, FIG. 10B Right-angle Tetrahedron, FIG. 10C Double Tetrahedron
Figure 10B:
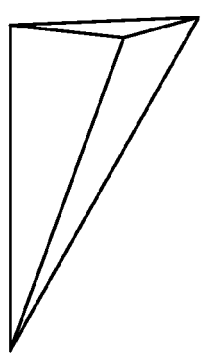
FIG. 10D: Extraction efficiency (EQE) of different couplers

Based on EI one can now attempt to identify a geometrical shape having a largest GEAR, i.e. a largest ratio of total face area to its base area. The best candidate for forward extraction is a tetrahedron, a polyhedron composed of four triangular faces, three of which meet at each vertex. A well known tetrahedron shown in FIG. 10A is one in which the four triangles are isosceles, and is one of the Platonic solids. Right angle tetrahedron with an apex lying on a vertical line extending from the base vertex (TRAP—triangular right angle pyramid) shown in FIG. 11B has a maximal GEAR among all tetrahedrons. It also has a smaller apex angle and longest slant length giving grounds to assume that more flux will be extracted in a sideward directions. Indeed, simulation results reveal that it is superior to any other previously studied shapes.

Figure 10C:
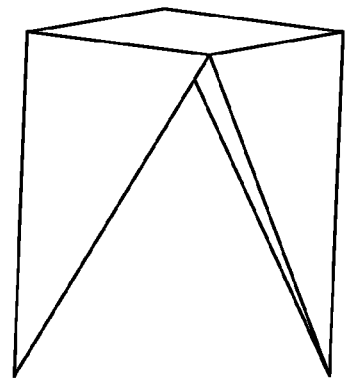

A double tetrahedron shown in FIG. 10C produced by cutting a cube along a diagonal is more suited to a current practice of using squarely cut chips. While its extraction performance falls slightly below a single tetrahedron it is still significantly better than any other shape.

For a device with a given EQE, a smaller GEAR signifies a more compact device having larger mean surface luminance. By having a more compact chip, one not only saves the wafer: the whole primary optics and device footprint becomes proportionally smaller.

Figure 10D:
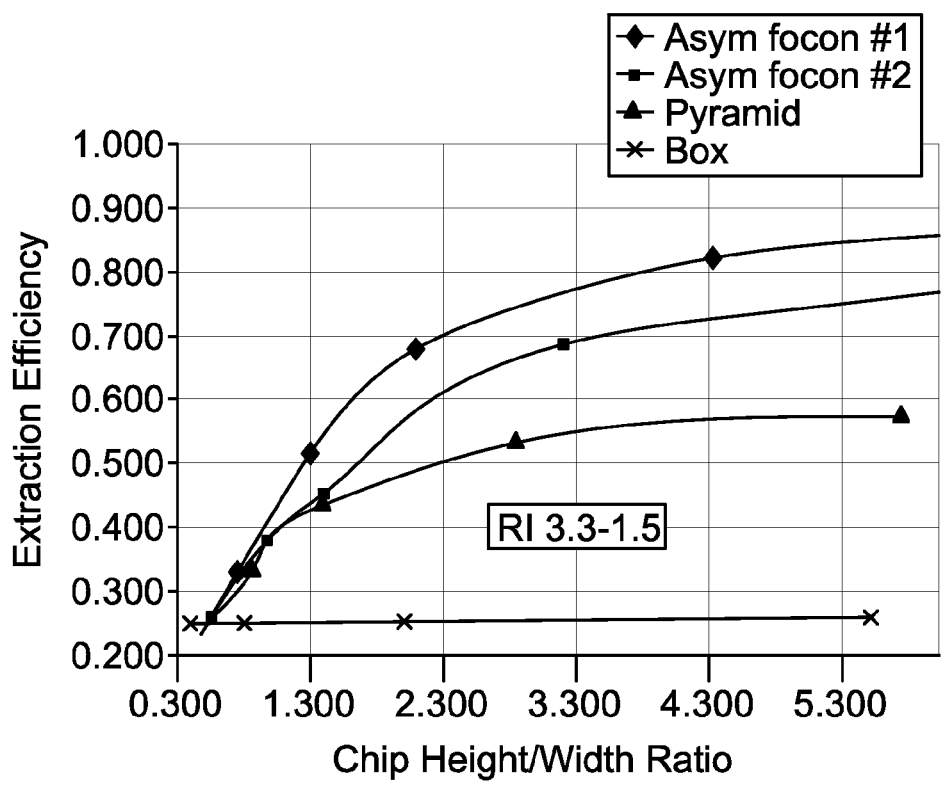
Figure 10D:
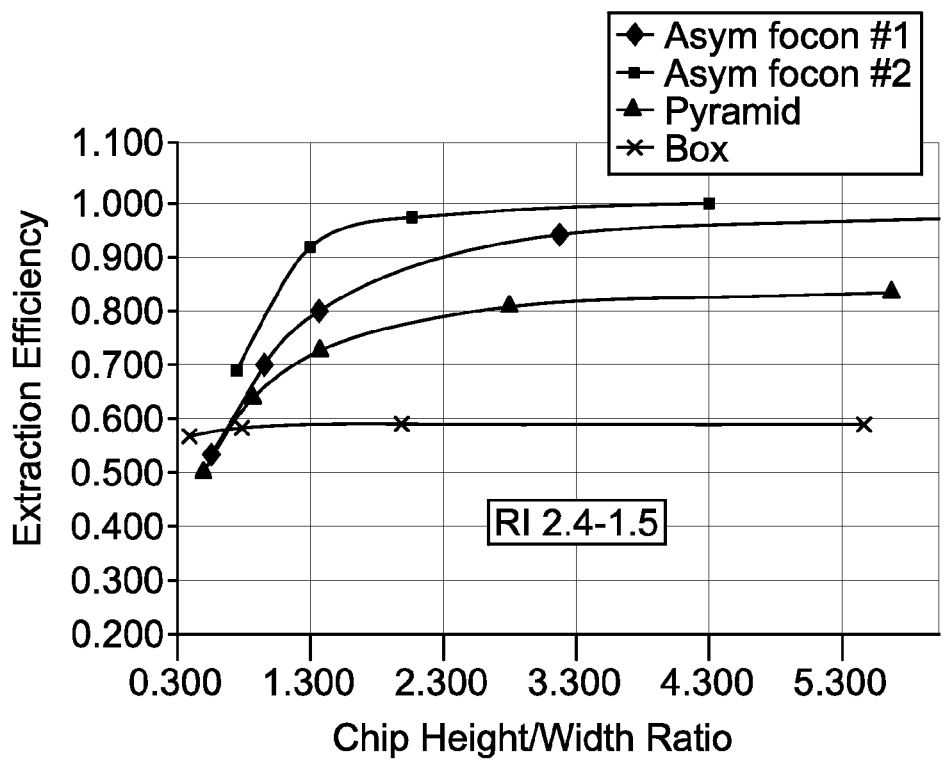

FIG. 10D shows EQE of various polyhedrons plotted against their vertical aspect ratio Z/X. This AR is an index of merit showing a relative thickness of a device and, in a case of shaped dies, an initial thickness of a planar wafer substrate layer, which is cut, diced or etched to produce a final shape. Polyhedra with smaller AR are also easier and less costly to produce by one of the known methods, such as cutting, etching, sinker electrical discharge machining (EDM), by a diamond turning machine etc, As predicted a regular tetrahedron and in particular TRAP has the highest EQE significantly outperforming all other shapes: EQE>0.9 for AR=1.3, while square pyramid never reaches this value for any AR. To make it more suitable for assembly tetrahedron can be truncated to have a blunt planar triangular apex. TRAP has another key benefit making it a solution of choice for FIDs with SRCs. It is a most compact side emitting device emitting 75-90 percents of the flux within TIR critical angles of a planar SRC waveguide. Thus, for pcLED with decoupled extraction disclosed hereinabove no side converting coupler is needed at all, meaning that SRC thickness can be reduced to an absolute minimum of 0.5-1.5 die's horizontal dimension. No other system comes close to this limit.

Another peculiar property of TRAP structures is that additional face etching has generally no positive effect. Just on the opposite, in most cases it reduces EQE by recycling more flux onto an emitter through an additional scatter in a backward direction. Faces of TRAP can also have any curvature, which can be a result of manufacturing constraints. However, if a TRAP is sufficiently large, an effect of such curvature compared to flat faces is small, as indeed immediately follows from the principle set by EI.

We conclude this section by considering an important issue of packaging density. TRAPs should not be spaced too closely. Theoretical considerations based on EI predict that in the limiting case of continuously (hexagonically) packed polyhedra of any shape, their behavior is very similar, so that the first recycled flux is almost the same as for a smooth surface. The EQE improvement in this case is due to a principally different mechanism, namely suppression of trailing MIRs causing a total extinction of trapped photons in e.g. rectangular wave guides. Same and better performance could be obtained by using a diffuse back die reflector instead of current mirror reflectors and save a need for die etching.

One can conclude that TRAP is the ideal flux extracting shape.

Embodiment 9

Primary Optics for Planar and Shaped Emitters

Consider next compact forward-extracting couplers for planar dies (which constitute the majority of existing SMD LEDs). Clearly, some flux is reabsorbed on a conformal die-encapsulant interface even before reaching an encapsulant-air interface. In many cases the latter is also planar and causes additional losses proportional to $1.5^2$. Some of more efficient devices have a hemispherically shaped encapsulator whose diameter is slightly larger than die's size. While their performance is below TRAP they meet practical requirements. We are concerned here with two major issues: a) further improving encapsulant outer shape and b) using encapsulant materials with a higher N. Although a possibility of using such materials has been occasionally discussed in the past, no practical devices have been proposed or implemented by the industry so far. Coming back to EI we can now understand a reason for this failure and outline a new design principle. Higher N is a necessary but not sufficient condition to improve EQE. Indeed, conformal chip-encapsulant-air interfaces having the same extraction area do not bring any improvement whatsoever. To take a full advantage of higher N, two additional critical requirements must be fulfilled, namely—each interface should have a proportionally larger area and an optimal non-conformal shape.

Figure 11A:
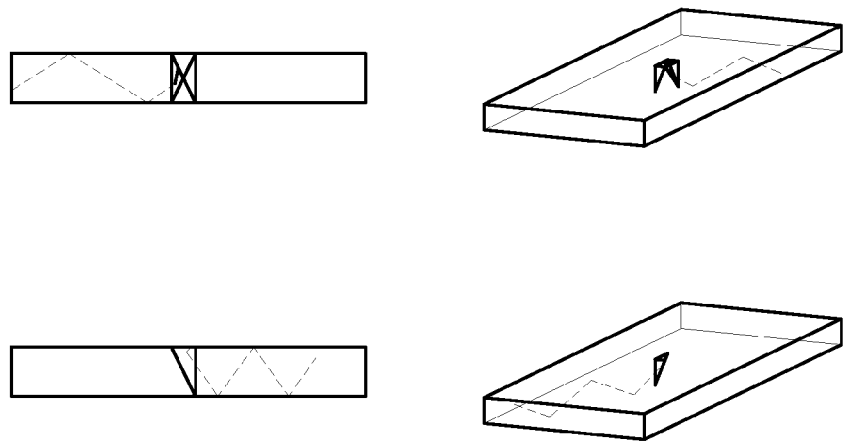
FIG. 11A: Single (lower) and Double Tetrahedron couplers in encapsulated in planar waive guide (Example 9)

FIG. 11A shows a planar InGaN die with a TRAP zirconium coupler (N=2.4) having almost ideal index match. It has EQE of a similarly shaped die, but offers a less expensive production method. Zirconium is a low cost material which can be easily polished and cut by existing mass production techniques. TRAP coupler should be bonded (by e.g. zirconium based agent) or tightly attached to die's surface and then encapsulated by either a planar or shaped conventional plastic with N≈1.5. Its respective normalized area should be at least $2.4^2=5.76$ or $(2.4/1.5)^2=2.56$. One can conclude that a use of optimally shaped second-stage epoxy coupler (described below) can significantly reduce the cost of a more expensive zirconium coupler or shaped die.

Other diamond-like shapes (e.g. various polyhedrons and dual polyhedrons) can also be used as couplers, although their extraction performance is lower than TRAP shapes.

Figure 11B:
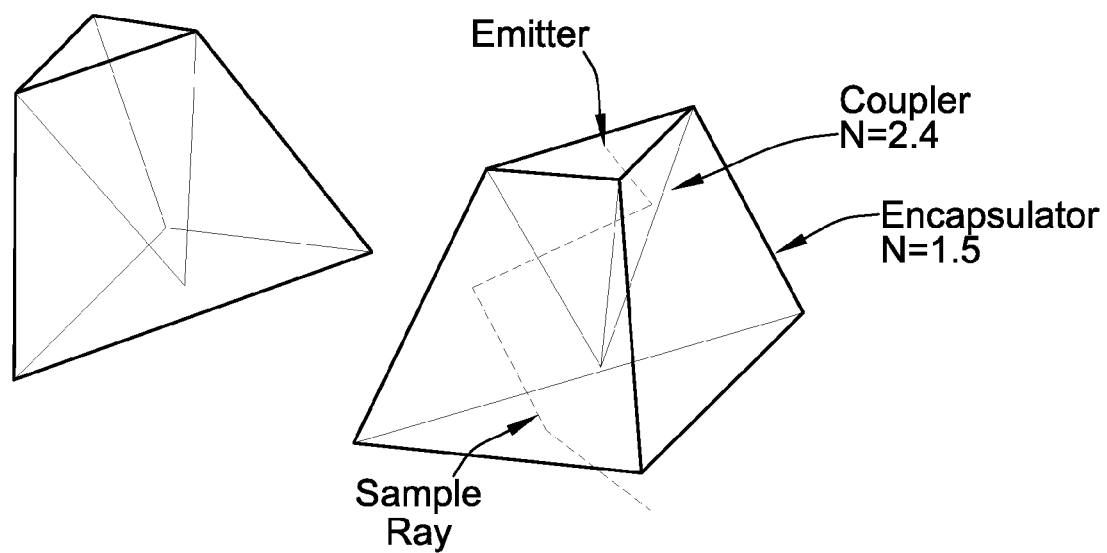
FIG. 11B: Planar Emitter coupled to Zirconium tetrahedron coupler encapsulated into a larger inverted truncated tetrahedron with $N \approx 1.5$
Figure 11C:
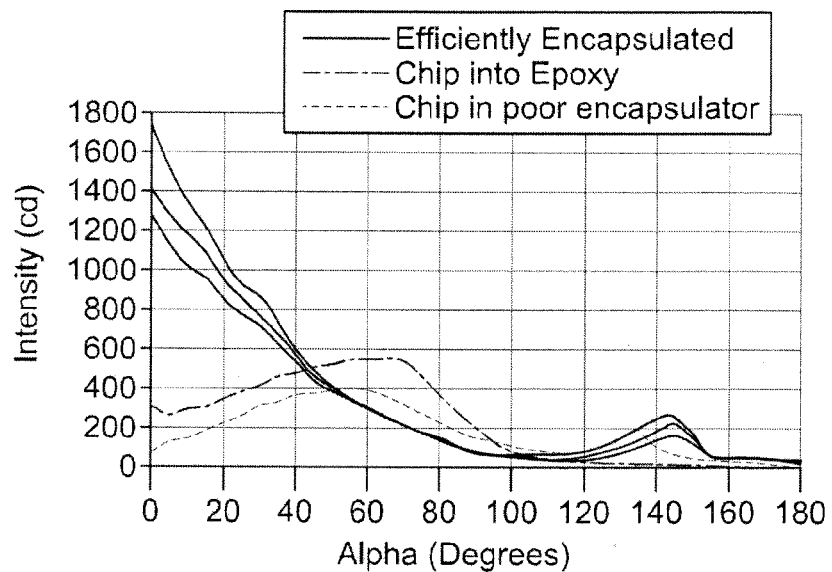
FIG. 11C: Light Intensity distribution for a double acongruent coupler shown in FIG. 11B FIG. 12A: A stack of three FID modules separated by two air interfaces

The general EI based principle can be extended to multi-element vertically stacked systems having multiple N interfaces. Each consecutive interface should be non-congruent with its neighbors. In contrast, congruent configurations, e.g. a stack of scaled pyramids, generally have a relatively poor extraction, due to enhanced trailing modes. FIG. 11B illustrates this principle. TRAP (AR=1.34) chip or planar chip with a similar zirconium TRAP is encapsulated into a scaled, inverted and rotated secondary larger epoxy TRAP. FIG. 11C shows first pass LID for secondary TRAPs with different slant length. For reference the total internally generated flux is normalized to 1000π lm having an intrinsic on-axis intensity of 1000 cd (lambertian radiator) and $1000/2.4^2=173.6$ cd in the air. A performance of a conventional compact box-like encapsulant lens common for SMT designs is also shown for comparison.

Thus, in addition to nearly ideal EQE>0.94, this system allows a considerable collimation of the extracted flux with an on-axis intensity amplification of 7.5 to 10 and higher, meaning that almost all forward emitting base of the inverted TRAP is fully filled with a virtual image of the source. In this respect a double non-congruent TRAP system is a fundamentally new compact and EQE-conserving device, competing with traditional parabolic, CEC and lens collimators.

Having considered numerous embodiments, we can now formulate a general basic design principle unifying all considered devices. Let us first postulate a new fundamental invariant of Light Field theory first described in a classical book by A. Gershun.

We postulate general characteristics of optimally shaped or/and roughened, yet complex, multiple three-dimensional radiation-extracting arrays having zero flux recycling. The minimal total flux extracting surface area of the extractor should be at least $N^2$ larger than the area of the primary emitter:

$$S_{ext} \geq S_{em} \times N^2_{ext},$$

where $S_{ext}$ and $S_{em}$ are areas of the die and the extractor, respectively.

All surfaces should preferably be uniform lambertian radiators with $L_{ext}=L_{em}/N_{em}^2$.

Obviously, real devices may have less than 100% collection efficiency, but the invariant provides a sound basis for selecting an optimal chip design: For a given EQE such a chip-focon combination should be as small as possible.

Surface Roughening.

As already explained surface roughening of conformal waveguide arrays has only a limited EQE improving potential not above EI limit of $1/(N_{em}/N_{ext})^2$. It can be shown that in the best case it can outcouple the residual Fresnel reflections within a TIR angular cone. It can also be shown that such a surface should have a zero hem/hem integral "inverse" reflectance to an ambient radiation impinging on its outer surface across a whole range of a spectrum and incident angles. In other words, it should be a flat equivalent of a classic "Black Hole". There is a prevailing opinion that no such surface can possibly exist, since conventional TFAR coatings or "Moth eye" employing destructive interference and graded N cannot in principle have a zero reflectance flat across wavelength and incident angle of incident radiation.

Figure 13:
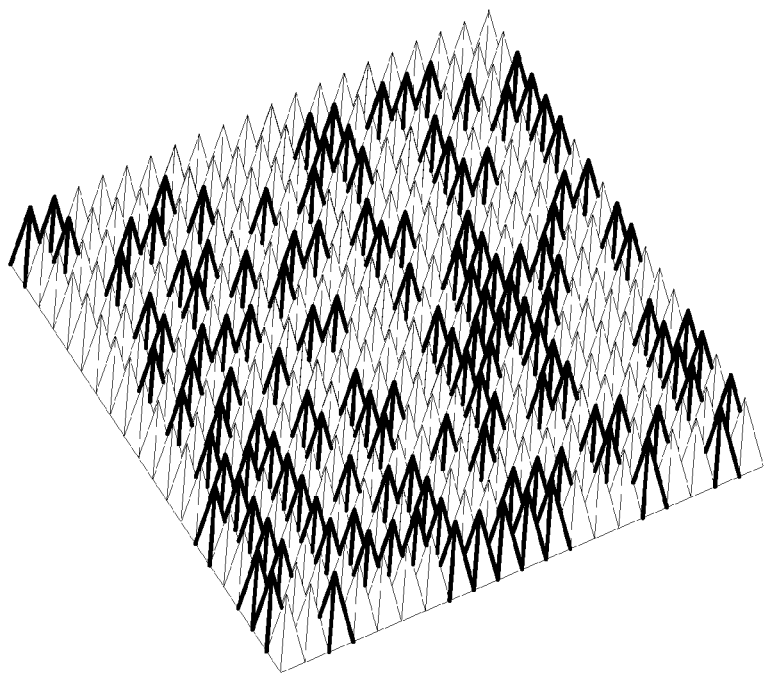
FIG. 13: Polyhedrally Roughened Surface with close to zero hem/hem reflectance.
Figure 13:
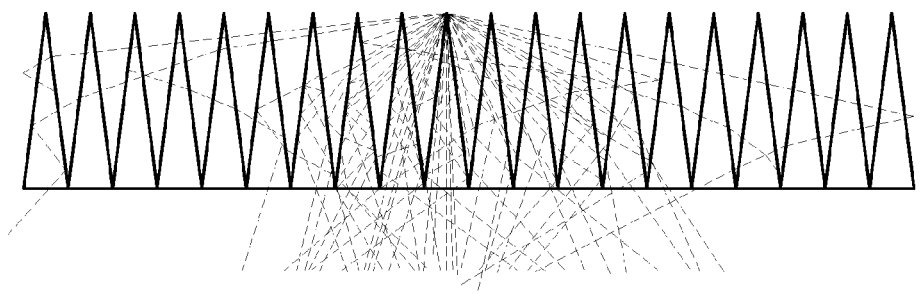

FIG. 13 shows a surface continuously roughened by densely packed TRAP array having high AR>>1. Reflectance can be reduced to any however small value by increasing AR, which should be larger for higher N. Thus already for 4<AR<6 (corresponding to apex angles of 15-10 degrees) total reflectance drops to 0.01-0.0001%. for 1.5<N<2.4. Compared to a planar graded N system photons are additionally deflected into forward direction by multiple inclined air-material interfaces. An array should be sufficiently large in XY plane to suppress possible side extraction on a perimeter. As predicted by EI principle a first pass transmission of an immersed planar emitter is $1/N_{em}^2$.

Embodiment 10

Multielement Systems Comprising a Stack of Individual Full Crater FIDs

Figure 12A:
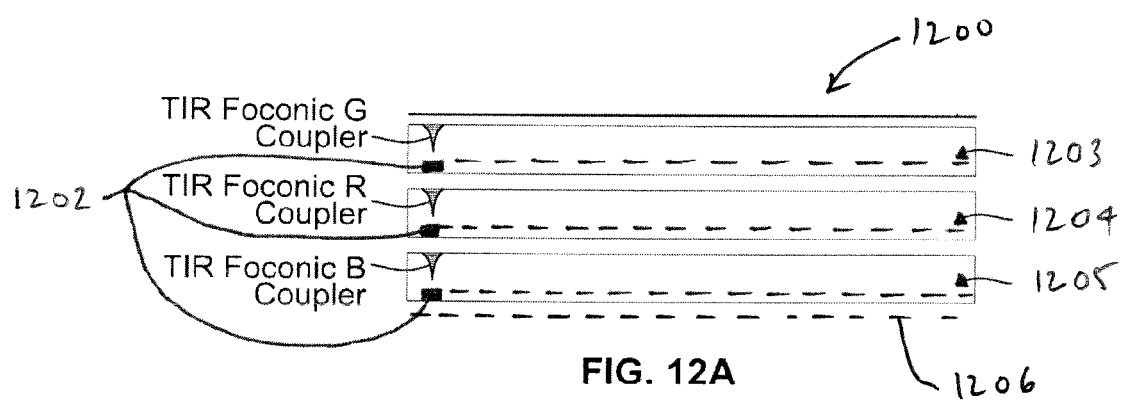
FIG. 12B: Gray scale convolution (right) performed on a Blue channel of an original image

FIG. 12A illustrates a stack of three FID modules 1200 similar to those depicted in FIG. 5D separated by two air interfaces. Each module 1203-1205 is powered by a Blue LED 1202 placed at a left edge outside an active illumination window. Two upper layers 1203, 1204 further comprise ultrathin red and green phosphors. Such stack system offers three benefits:

Intra-phosphor radiation transport is further reduced as a fraction of downconverted radiation is contained within its respective waveguide and up to 50% is extracted upward.

Color can be adjusted from warm to cool or any saturated hue.

Thermal load is dissipated among three LEDs reducing overheating.

In yet another embodiment each module is powered by a single color preferably monochromatic R, G, B LEDs and has neutral distributed extractors 1203, 1204, and 1205 (DOPEs), for example a thin layer of a white paint or preferably weakly roughened waveguide face as described hereinabove. An overlay of black paint 1206 can be optionally added to improve a dynamic image range and suppress ambient reflections in black segments of a displayed image. The device in this embodiment can be used for LCD backlighting lighting, general lighting or to display any colored image content by using an additive principle, similar to color CRT and OLED devices. In contrast, all existing lighted information displays, LCDs and printing industry are based on a color subtraction method requiring a white backlight or external light source of good color quality. Per definition, a reproduction of pure monochromatic colors is not possible with this method, as it would lead to zero reflectance or transmittance.

Figure 12B:
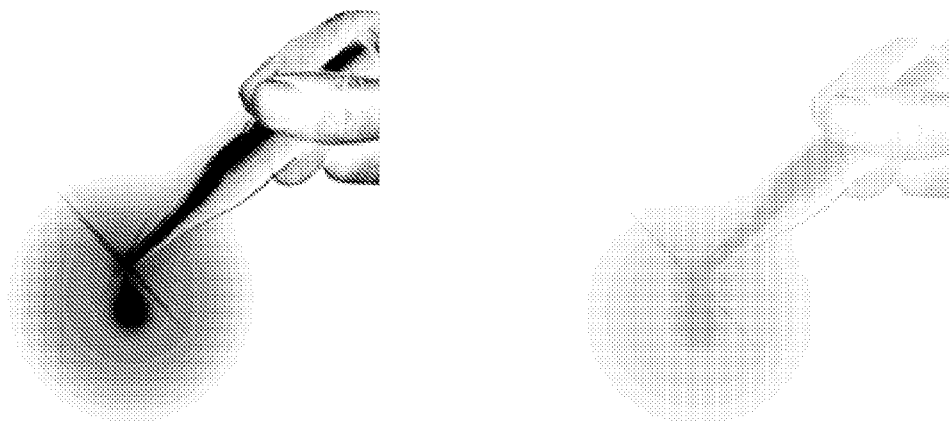

To enable this method a special attention should be given to CF distribution and it maximal density. Clearly, an original image should be separated into three color channels (color separation) and each channel should be transformed by convolution with its CF to preserve original shades of gray. Secondly, maximal CF should be made sufficiently low to reduce retroreflection and scattering interactions between the waveguides, which may jeopardize image resolution and color fidelity. FIG. 12B shows an example of such gray scale convolution (right) performed on a Blue channel of an original image. Key advantages:

Up to ten time power savings, especially for saturated Blue and Red colors.

Maximally wide color gamut of reproduced colors, principally not attainable with subtractive technique.

No need for color paints of any kind.

Better color reproduction fidelity.

Color adjustment in different lighting ambients

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

The invention claimed is:

1. An apparatus to serve for display or lighting, comprising:
a hybrid wave guide with at least one edge and two faces, at least one of said faces including a multi-sectioned, doubly curved light guiding arrangement;
at least one light source, coupled to the other of the said faces of the hybrid wave guide; and
a reflector, disposed proximate to at least one of the faces;
wherein light is injected into the hybrid wave guide by said light source in a first direction and exits said light guiding arrangement in a second direction, and said light guiding arrangement has a thickness that diminishes nonlinearly as a function of distance from each of said light sources along both coordinate axes of the respective faces.

2. The apparatus of claim 1, further including a foconic coupler disposed between any of said light sources and the respective face of the wave guide.

3. The apparatus of claim 2, configured to serve as a backlight for a display device.

4. The apparatus of claim 1, further including at least one passive or/and active light extractor, disposed integrally to one or both of the faces of the wave guide.

5. An apparatus as in claim 4, wherein any of said extractors include a thin layer, a solution, a suspension or a compound of passive light scattering agents or of active, wavelength converting, agents, roughened surfaces or a mixture of any of these means.

6. An apparatus as in claim 1, wherein said light source includes a ultraviolet, blue, white or tri-color (Red Green Blue) radiator, having a single or multiple escape cones.

7. An apparatus as in claim 2, wherein said foconic coupler and said doubly curved wave guide form a symmetrical compound surface having multiple segments, with mutually different curvatures.

8. An apparatus as in claim 7, wherein at least two of said segments are hyperbolic.

9. An apparatus as in claim 7, wherein at least one segment is hyperbolic and at least one other segment is elliptic.

10. An apparatus as in claim 7, wherein at least one of said segments includes a reflector.

11. An apparatus as in claim 2, wherein the foconic coupler and said light guiding arrangement form an asymmetrical compound surface, having mutually different curvatures along different horizontal azimuthal directions.

12. An apparatus as in claim 11, wherein said compound surface has multiple segments with mutually different curvatures along each of said azimuthal directions.

13. An apparatus as in claim 12, wherein at least two of said segments are hyperbolic along each of said coordinate axes.

14. An apparatus as in claim 12, wherein, along each of said coordinate axes, at least one segment is hyperbolic and at least one other segment is elliptic.

15. An apparatus as in claim 1, wherein said doubly curved face of said wave guide has a compound forward-extracting multi-sectional elliptic surface, forming an asymmetrical surface that has mutually different curvatures along different azimuthal directions of said faces.

16. An apparatus as in claim 2, wherein said foconic coupler has a two-dimensional linear shape, formed by a translation of a constant vertical cross-section along a horizontal axis.

17. A lighting device as in claim 2, wherein said foconic coupler has a truncated shape, with an apex having a planar, elliptic or hyperbolic surface.

18. An apparatus as in claim 17, wherein said apex surface is transparent.

19. An apparatus as in claim 17, wherein said apex surface has a reflective layer.

20. A liquid crystal display device, comprising:
a liquid crystal display module; and
a backlight structure, including:
a light source,
a wave guide, including two faces,
a primary foconic coupler disposed between the light source and a face of the wave guide,
a secondary doubly curved waveguide section coaxial with the light source or centered at the light source and integrally formed with the primary foconic coupler,
at least one passive and/or active downconverting light extraction/conversion means, disposed integrally to one or both of the faces of the wave guide and/or the light source, and
extraction/conversion means, disposed integrally to one or both of the faces of the wave guide and/or the light source, and
a reflector disposed proximate to one of the faces of the wave guide.

21. An apparatus as in claim 1, wherein said wave guide has edges formed by coaxial spherical segments alternating with radial linear segments.

22. An apparatus as in claim 2, wherein said wave guide is substantially thicker in regions that are not in contact with said foconic couplers, thereby forming an Induced Photonic Recycling Chamber.

23. An apparatus as in claim 1, wherein said light source is shaped as a tetrahedron with a vertical aspect ratio of between 0.5 and 3.

24. An apparatus as in claim 23, wherein said tetrahedron is isosceles.

25. An apparatus as in claim 23, wherein said tetrahedron is a right angle tetrahedron, having a right angle base.

26. An apparatus as in claim 1, wherein said light source is shaped as a double right angle tetrahedron with a vertical aspect ratio of between 0.5 and 3.

27. An apparatus as in claim 23, wherein said tetrahedron is truncated.

28. An apparatus as in claim 2, wherein any of the foconic couplers is shaped as a tetrahedron.

29. An apparatus as in claim 28 wherein any of the foconic couplers has a refraction index of between 1.5 and 2.4.

30. An apparatus as in claim 28, wherein said foconic coupler is encapsulated in an inverted truncated tetrahedral lens, having an essentially larger size and an essentially lower refraction index.

31. An apparatus as in claim 4, wherein said active extractors are deposited with a non-uniform two-dimensional density distribution.

32. An apparatus as in claim 4, wherein some of said active extractors differ from others in the wavelength of the emitted light and are deposited correspondingly in different regions of said wave guide.

33. An apparatus as in claim 2, further comprising two additional wave guides, similar to said wave guide, all three of said wave guides being arranged in a vertical stack, separated by air interfaces.

34. An apparatus as in claim 1, wherein one of the faces of said waveguide is roughened by a two dimensional array of polyhedrons with a vertical aspect ratio of between 1.5 and 15.

35. The apparatus as in claim 1, wherein said doubly curved face of said wave guide has a compound forward-extracting elliptic profile, forming an asymmetrical surface that has mutually different curvatures along different coordinate axes of said faces.

* * * * *